(12) United States Patent
Tsukiji et al.

(10) Patent No.: US 9,553,510 B2
(45) Date of Patent: Jan. 24, 2017

(54) SWITCHING REGULATOR CONTROL CIRCUIT, SWITCHING REGULATOR, ELECTRONIC APPLIANCE, SWITCHING POWER SUPPLY DEVICE, AND TELEVISION RECEIVER

(75) Inventors: Nobukazu Tsukiji, Kyoto (JP); Kazuhiro Murakami, Kyoto (JP); Masashi Nagasato, Kyoto (JP); Tadashi Akaho, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 266 days.

(21) Appl. No.: 13/469,329

(22) Filed: May 11, 2012

(65) Prior Publication Data
US 2012/0286752 A1    Nov. 15, 2012

(30) Foreign Application Priority Data

May 13, 2011 (JP) .................................. 2011-108658
Jun. 22, 2011 (JP) .................................. 2011-137998
Apr. 25, 2012 (JP) .................................. 2012-099956

(51) Int. Cl.
| | |
|---|---|
| G05F 1/10 | (2006.01) |
| H02M 3/156 | (2006.01) |
| H04N 5/63 | (2006.01) |
| H03K 17/16 | (2006.01) |
| H02M 1/00 | (2006.01) |

(52) U.S. Cl.
CPC ............... *H02M 3/156* (2013.01); *H04N 5/63* (2013.01); *H02M 2001/009* (2013.01); *H02M 2001/0029* (2013.01); *H03K 17/163* (2013.01)

(58) Field of Classification Search
None
See application file for complete search history.

(56) References Cited

U.S. PATENT DOCUMENTS

| | | | | |
|---|---|---|---|---|
| 3,733,540 | A * | 5/1973 | Hawkins | 363/89 |
| 6,498,517 | B2 * | 12/2002 | Miyazaki | 327/59 |
| 6,791,368 | B2 * | 9/2004 | Tzeng et al. | 327/51 |
| 2001/0054760 | A1 * | 12/2001 | Ito et al. | 257/691 |

(Continued)

FOREIGN PATENT DOCUMENTS

| | | | | |
|---|---|---|---|---|
| EP | 648020 | A2 * | 4/1995 | H03K 19/003 |
| EP | 783792 | B1 * | 3/2002 | H02M 7/42 |
| JP | 2008-092712 | | 4/2008 | |

*Primary Examiner* — Timothy J Dole
*Assistant Examiner* — Monica Mata
(74) *Attorney, Agent, or Firm* — Fish & Richardson P.C.

(57) ABSTRACT

A high-side variable current source and a high-side transistor are provided in series between a supply power terminal of a control circuit and a gate of a switching transistor. A low-side variable current source and a low-side transistor are provided in series between the gate of the switching transistor and a ground terminal. A slew rate controller controls the current value of at least one of the high-side and low-side variable current sources according to the state of a setting terminal. A switching power supply device has a plurality of output transistors connected in parallel with one another and a controller that generates control signals turning on and off the output transistors at a predetermined frequency so as to generate a desired output voltage from an input voltage and supply the output voltage to a load. The controller determines which output transistor to drive according to the magnitude of the load.

4 Claims, 20 Drawing Sheets

(56) References Cited

U.S. PATENT DOCUMENTS

| | | | |
|---|---|---|---|
| 2002/0017897 A1* | 2/2002 | Wilcox et al. | 323/282 |
| 2004/0130307 A1* | 7/2004 | Dequina et al. | 323/282 |
| 2005/0007086 A1* | 1/2005 | Morimoto | 323/282 |
| 2005/0218877 A1* | 10/2005 | Oswald et al. | 323/282 |
| 2006/0250121 A1* | 11/2006 | Tzeng et al. | 323/288 |
| 2007/0287495 A1* | 12/2007 | Takuma | 455/550.1 |
| 2008/0116865 A1* | 5/2008 | Rice | H02M 3/1584 323/280 |
| 2008/0136389 A1* | 6/2008 | Uchimoto et al. | 323/282 |
| 2009/0033305 A1 | 2/2009 | Hane | |
| 2009/0195298 A1* | 8/2009 | Nakai | 327/536 |
| 2010/0001704 A1* | 1/2010 | Williams | 323/283 |
| 2010/0156366 A1* | 6/2010 | Sakai et al. | 323/282 |
| 2010/0295521 A1* | 11/2010 | Odaohhara | G06F 1/26 323/282 |
| 2011/0018593 A1* | 1/2011 | Williams | 327/109 |
| 2011/0043250 A1* | 2/2011 | Kuwana et al. | 326/89 |
| 2011/0248688 A1* | 10/2011 | Iacob et al. | 323/234 |
| 2012/0146716 A1* | 6/2012 | Shi et al. | 327/540 |

* cited by examiner

FIG. 8

| S1 | S2 | S3 |
|----|----|----|
| H  | H  | UP |
| L  | H  | KEEP |
| L  | L  | DOWN |

SWITCHING REGULATOR CONTROL CIRCUIT, SWITCHING REGULATOR, ELECTRONIC APPLIANCE, SWITCHING POWER SUPPLY DEVICE, AND TELEVISION RECEIVER

CROSS-REFERENCE TO RELATED APPLICATIONS

This application is based on the following Japanese Patent Applications, and the contents of which are hereby incorporated by reference:
(1) Japanese Patent Application No. 2011-108658 (the filing date: May 13, 2011)
(2) Japanese Patent Application No. 2011-137998 (the filing date: Jun. 22, 2011)
(3) Japanese Patent Application No. 2012-099956 (the filing date: Apr. 25, 2012)

BACKGROUND OF THE INVENTION

1. Field of the Invention

The present invention relates to a switching regulator control circuit. Besides, the present invention relates to a switching power supply device.

2. Description of Related Art

<First Background Art and Problem>

A power transistor is used in a switching regulator, a motor driver and other various electronic apparatuses. FIG. 1 is a circuit diagram showing a structural example of a switching regulator of voltage step-up type that has a power transistor.

The switching regulator 2r includes: a control circuit 100r; an inductor L1; a rectification diode D1; and an output capacitor C1.

The control circuit 100r has a switching transistor M1 that is a power transistor; a pulse signal generation portion 10; and a driver circuit 20r. An output voltage $V_{OUT}$ from the switching regulator 2r is divided by resistors R1 and R2. The pulse signal generation portion 10 receives a feedback voltage $V_{FB}$ in accordance with the output voltage Vout from the switching regulator 2r, and generates a pulse signal $S_{PWM}$ whose duty ratio is adjusted such that the feedback voltage $V_{FB}$ nears a target level. The driver circuit 20r, based on the pulse signal $S_{PWM}$, switches the switching transistor M1.

To switch on/off of the switching transistor M1, it is necessary to switch the level of a voltage (gate signal VG) of the control terminal (gate) between two values of a high level (power supply voltage) and a low level (ground level).

The driver circuit 20r is composed to be an inverter type that has a high-side transistor M2 and a low-side transistor M3. In this structure, a transition time (rise time $T_R$) at the time the gate signal $V_G$ rises from the low level to the high level is decided depending on an electric current capability of the high-side transistor M2, while a transition time (fall time $T_{RF}$) at the time the gate signal $V_G$ falls from the high level to the low level is decided depending on an electric current capability of the low-side transistor M2.

Efficiency of the switching regulator 2r becomes higher as the transition times $T_R$ and $T_F$ become shorter. On the other hand, if the transition times $T_R$ and $T_F$ become short, high-frequency electro-magnetic (EMI: Electro-Magnetic Interference) noise becomes a problem. In other words, the efficiency and the EMI are in a tradeoff relationship.

Generally, it is possible to measure electro-magnetic noise in a state only where the switching regulator 2r is mounted in a set. And, in the measurement result, in a case where the EMI regulations are not met, as an EMI measure, a set designer needs to make great efforts of modifying the control circuit 100r, the inductor L1 and a peripheral printed board and the like.

In the control circuit 100r in FIG. 1, the transition times $T_R$ and $T_F$ of the gate signal $V_G$ are decided by the capability of the transistors M2 and M3. Great efforts are required for the EMI measure, on the other hand, even in a case of being mounted in any set, the control circuit 100r is required to have universality to operate with no problem. Accordingly, the conventional control circuit 100r is designed with the transition times $T_R$ and $T_F$ prolonged such that electromagnetic noise does not occur, so that it is necessary to sacrifice the efficiency.

<Second Background Art and Problem>

Conventionally, a switching power supply device is disclosed and proposed, which performs switching control of PWM [pulse width modulation] type in a heavy load region and switching control of PFM [pulse frequency modulation] type in a light load region.

Here, as an example of a conventional technology related to the above description, there is JP-A-2008-92712.

According to the above second background art, the efficiency of the switching power supply device is raisable in a wide load region ranging from the heavy load region to the low load region (see FIG. 11).

However, in the switching control of PFM type, a switching frequency changes, accordingly, in a case where the switching frequency overlaps a frequency band of a voice signal and a radio signal, trouble and the like occur in voice output and radio communication, whereby a risk is raised, in which performance of an application incorporating the switching power supply device is impaired.

Besides, in an application which uses a rectangular wave-shaped switch voltage, which is obtained during a process where a desired output voltage is generated from an input voltage by using the switching power-supply device, in a subsequent stage circuit (e.g., a charge pump circuit), there is a risk that operation of the subsequent stage circuit becomes unstable thanks to a change in the switching frequency, accordingly, it is hard to use the conventional technology that uses the switching control of PFM type to increase the efficiency.

SUMMARY OF THE INVENTION

In light of the above problems found by the inventors of the present application, it is an object of the present invention is to provide a switching regulator that is able to optimize a balance between the efficiency and the EMI for every set in which the switching regulator is incorporated.

Besides, in light of the above problems found by the inventors of the present application, it is an object of the present invention to provide a switching power supply device that is able to achieve high efficiency in a wide load region ranging from a heavy load region to a low load region without causing a change in a switching frequency.

An aspect of the present invention relates to a control circuit for a switching regulator. The control circuit includes: a switching transistor; a pulse signal generation portion that generates a pule signal whose duty ratio is adjusted such that a feedback voltage in accordance with an output voltage from the switching regulator becomes equal to a predetermined reference voltage; a driver circuit that drives the switching transistor in accordance with the pulse signal; and a setting terminal that sets a transition time of a gate signal of the switching transistor; wherein the driver circuits includes following component and is integrated on a semiconductor substrate: a high-side transistor that is disposed across a power supply terminal of the control circuit and the gate of the switching transistor; a low-side transistor that is disposed across the gate of the switching transistor and a ground terminal; at least one of either a high-side variable current source is disposed in series with the high-side transistor across the power supply terminal and the gate or a low-side variable current source is disposed in series with the low-side transistor across the gate and the ground terminal; and a slew rate control portion that controls, in accordance with an instruction through the setting terminal, an electric current value of at least one of either the high-side variable current source or the low-side variable current source. The control circuit is integrated on one semiconductor substrate.

A current flowing in the high-side transistor or the low-side transistor is defined by a current that is generated by the high-side variable current source or the low-side variable current source. And, a rise time span and a fall time span of the gate signal change depending on the current flowing in the high-side transistor and the current flowing in the low-side transistor, respectively. According to the control circuit of this aspect, it is possible to change the transition time of the gate signal in a state where the switching regulator is incorporated in a set, accordingly, the maximum efficiency is achievable in a range where the EMI specifications are met.

The slew rate control portion may include a reference current source that generates a reference current in accordance with a circuit component connected to the setting terminal. At least one of either the high-side variable current source or the low-side variable current source may be structured to be able to generate a current proportional to the reference current.

The slew rate control portion may include an input transistor that is disposed on a route for a current in accordance with the reference current. At least one of either the high-side variable current source or the low-side variable current source may include an output transistor that is connected to form a current mirror circuit together with the input transistor.

An adjustment resistor may be able to be externally connected to the setting terminal. The reference current source may include: a first bipolar transistor of NPN type whose emitter is connected to the setting terminal; and a second bipolar transistor of PNP type whose emitter is connected to a base of the first bipolar transistor and whose base is connected to an application terminal of a predetermined reference voltage; wherein the reference current source may output a current flowing through the first bipolar transistor as the reference current.

A control signal specifying the transition time of the gate signal of the switching transistor is able to be input into the setting terminal, and the reference current source may generate a reference signal in accordance with the control signal.

Another aspect of the present invention is a switching regulator. This switching regulator includes the above control circuit.

Here, replacement of an arbitrary combination of the above structures, constituent elements, expressions of the present invention among a method, a device, a system and the like is also effective as an aspect of the present invention.

According to the above aspect, it becomes possible to optimize a balance between the efficiency and the EMI for every set.

Besides, a switching power supply device according to an aspect of the present invention is structured (first structure) to include: a plurality of output transistors that are connected in parallel with one another; and a control portion that generates on/off control signals for the plurality of output transistors at a predetermined frequency such that a desired output voltage is generated from an input voltage and supplied to a load; wherein the control portion decides a drive-target output transistor based on a weight of the load.

Here, in the switching power supply device having the above first structure, the control portion may be structured (second structure) to decide the drive-target output transistor such that a transistor size is made larger as the load becomes heavier and the transistor size is made smaller as the load becomes lighter.

Here, in the switching power supply device having the above first or second structure, the plurality of output transistors are structured (third structure) to be designed to have sizes that are different from one another.

Besides, in the switching power supply device having any one of the above first to third structures, the control portion is structured (fourth structure) to monitor a rectangular wave-shaped switch voltage that is generated at every time of performing on/off control of the drive-target output transistor, and to decide the drive-target output transistor based on a result of a comparison of the switch voltage, which is detected when the drive-target output transistor is in an on state, and a predetermined threshold voltage.

Besides, in the switching power supply device having the above fourth structure, the control portion is structured (fifth structure) to include: a first comparator that compares the switch voltage with the first threshold voltage to generate a first comparison signal; a second comparator that compares the switch voltage with a second threshold voltage lower than the first threshold voltage to generate a second comparison signal; a first latch that latches the first comparison signal when the drive-target output transistor is in the on state; a second latch that latches the second comparison signal when the drive-target output transistor is in the on state; and a determination portion that decides the drive-target output transistor based on the first comparison signal latched by the first latch and the second comparison signal latched by the second latch.

Besides, in the switching power supply device having the above fifth structure, the determination portion is structured (sixth structure) to decide the drive-target output transistor such that: a transistor size is enlarged by one step from a present size when the switch voltage is higher than the first threshold voltage; the transistor size is kept at the present size when the switch voltage is lower than the first threshold voltage and higher than the second threshold voltage; or the transistor size is made small by one step from the present size when the switch voltage is lower than the second threshold voltage.

Besides, in the switching power supply device having the above sixth structure, the control portion is structured to further include: an error amplifier that amplifies a difference between a feedback voltage in accordance with the output voltage and a predetermined reference voltage to generate an error signal; an oscillator that generates a clock signal and a slope signal at the predetermined frequency; a comparator that compares the error signal with the slope signal to generate a comparison signal; an SR flip-flop that receives inputs of the comparison signal and the clock signal to generate the on/off control signal; and a signal gate portion that receives a output from the determination portion and supplies the on/off control signal to the drive-target output transistor only.

Besides, the switching power supply device having any one of the above first to seventh structures is structured (eighth structure) to include a charge pump circuit that steps up the output voltage by using a rectangular wave-shaped switch voltage that is generated by performing on/off control of the drive-target output transistor.

Besides, the switching power supply device having any one of the above first to eighth structures is structured (ninth structure) to include a plurality of drivers that raise an electric current capability of the on/off control signal and supply it to the plurality of output transistors.

Besides, in the switching power supply device having the above ninth structure, the plurality of drivers are structured (tenth structure) to include a plurality of unit drivers each of which is connected in parallel with a control terminal of a corresponding output transistor, and operations of which are controlled separately from one another.

Besides, in the switching power supply device having the above tenth structure, the plurality of unit drivers are structured (eleventh structure) to be formed of transistors whose sizes are identical to one another.

Besides, the switching power supply device having the above tenth or eleventh structure is structured (twelfth structure) to further include an enable logic portion that generates an enable signal for each of the plurality of unit drivers in accordance with a slew rate adjustment signal.

Besides, in the switching power supply device having the above ninth structure, the plurality of output transistors are structured (thirteenth structure) to include a main transistor externally connected to a semiconductor device and a sub-transistor incorporated in the semiconductor device; the main transistor is smaller than the sub-transistor in on resistance value, and the sub-transistor is smaller than the main transistor in gate capacity value.

Besides, in the switching power supply device having the above thirteenth structure, the control portion is structured (fourteenth structure) to target the main transistor for driving in a heavy load region, and targets the sub-transistor for driving in a light load region.

Besides, a television according to an aspect of the present invention is structured (fifteenth structure) to include: a tuner portion that selects a broadcast signal for a desired channel from a reception signal; a decoder portion that generates an image signal and a voice signal from the broadcast signal selected by the tuner portion; a display portion that outputs the image signal as an image; a speaker portion that outputs the voice signal as a voice; an operation portion that receives a user operation; an interface portion that receives an external input signal; a control portion that controls operations of the above portions; and a power supply portion that supplies electric power to each of the above portions; wherein the power supply portion includes the switching regulator or the switching power supply device having any one of the first to fourteenth structures.

Besides, according to an aspect of the present invention, it becomes possible to provide a switching power supply device that is able to achieve high efficiency in a wide load region which ranges from a heavy load region to a light load region without causing a change in a switching frequency.

Here, other features, elements, steps, advantages, and characteristics of the present invention will become more apparent from the following detailed description of preferred embodiments and the attached drawings related to the description.

BRIEF DESCRIPTION OF THE DRAWINGS

FIG. 8 is diagram showing a correlation among signals S1 to S3.

DETAILED DESCRIPTION OF PREFERRED EMBODIMENTS

Slew Rate Variable Control

Hereinafter, the present invention is described based on preferred embodiments with reference to the drawings. The same or similar constituent elements, members and processes are indicated by the same reference numbers, and double description is skipped when necessary. Besides, the embodiments do not limit the present invention and examples, and all features described in the embodiments and a combination of them are not always essential for the present invention.

In the present specification, "a state in which a member A is connected to a member B" covers a case where the member A and the member B are connected to each other physically directly, and a case where the member A and the member B are indirectly connected to each other via another member that does not have a substantial influence on an electric connection between them or does not impair a function or an effect obtained by the connection between them. Likewise, "a state in which a member C is disposed between the member A and the member B" covers a case where the member A and the member C are directly connected to each other or the member B and the member C are directly connected to each other, and a case where the member A, the member B and the member C are indirectly connected to each other via another member that does not have a substantial influence on an electric connection among them or does not impair a function or an effect obtained by the connection among them.

Figure 2:
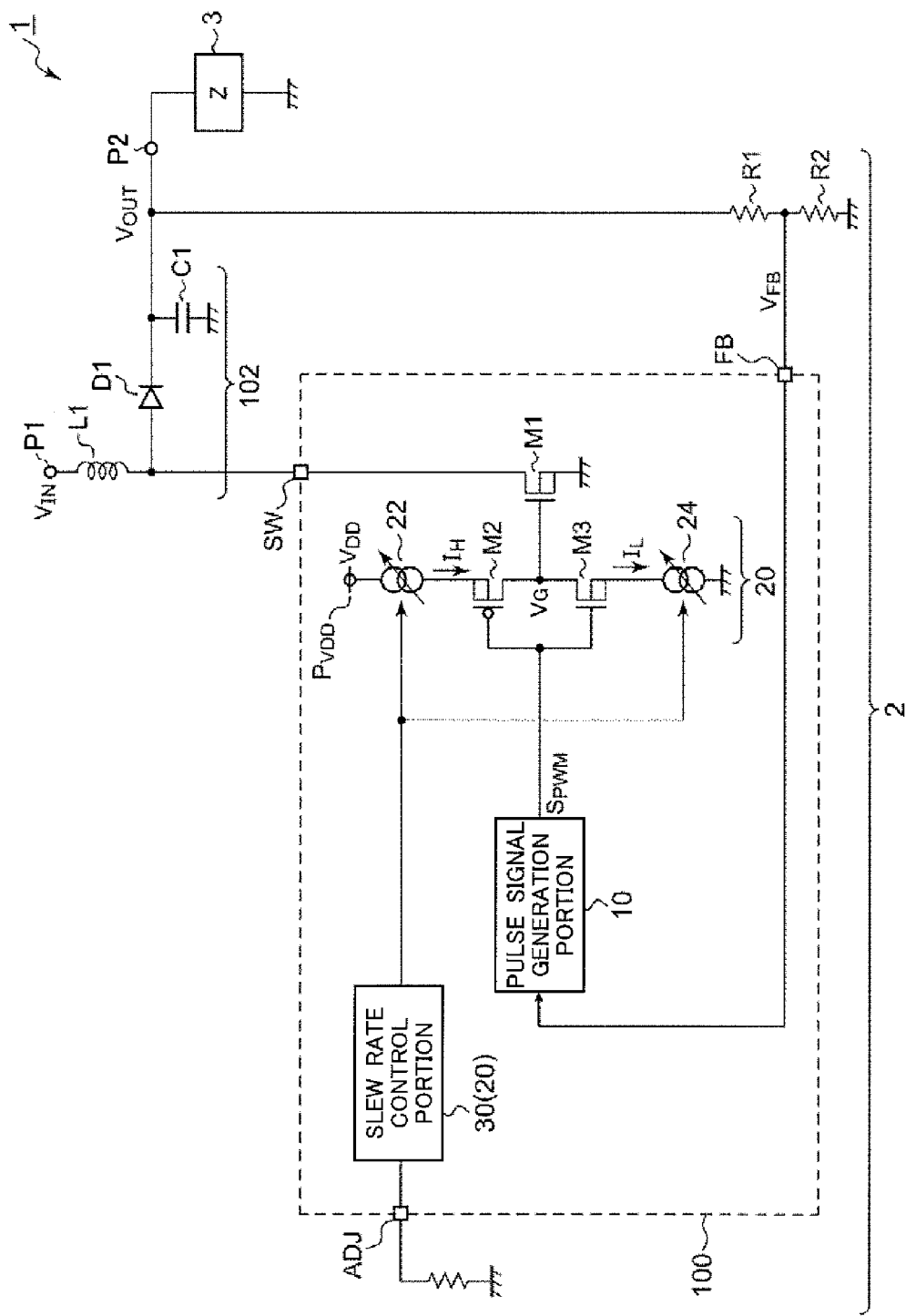
FIG. 2 is a circuit diagram showing a structure of an electronic appliance that incorporates a switching regulator according to an embodiment.

FIG. 2 is a circuit diagram showing a structure of an electronic appliance 1 that incorporates a switching regulator 2 according to an embodiment.

Figure 1:
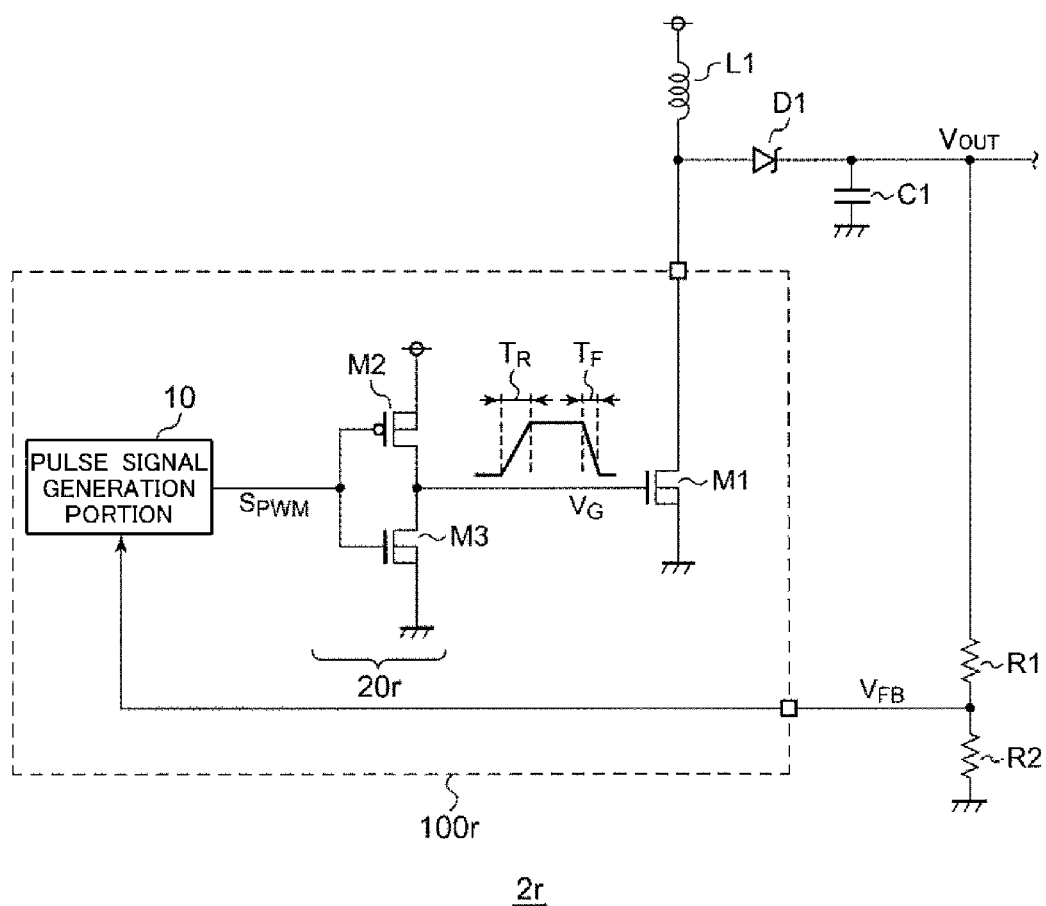
FIG. 1 is a circuit diagram showing a structural example of a switching regulator of voltage step-up type that has a power transistor.

The electronic appliance 1 includes a circuit block which needs a high power supply voltage, that is, an appliance, operating on a commercial a.c. power supply, which is a display device such as a liquid crystal display, a plasma display and the like or an image recording apparatus or a player which uses a DVD (digital versatile disc), a BLU-RAY DISC™ formatted disc or a hard disc, or a battery-driven appliance such as a note PC (personal computer), a digital camera, a digital video camera, a mobile phone terminal, a PDA (Personal Digital Assistance) and the like. As such a circuit block, a liquid crystal driver, an LED (Light Emitting Diode) and the like are exemplified and shown as a load 3 in FIG. 1.

The electronic appliance 1 includes a switching regulator 2 of voltage step-up type for supplying a power supply voltage to the load 3. An input voltage $V_{IN}$ is input into an input line P1 of the switching regulator 2. The switching regulator 2 steps up the input voltage $V_{IN}$ and outputs an output voltage $V_{OUT}$ to an output line P2.

The switching regulator 2 is a DC/DC converter of voltage step-up type, and includes a control IC 100 and an output circuit 102. The output circuit 102 includes an inductor L1, a rectification diode D1, and an output capacitor C1. Topology of the output circuit 102 is general, accordingly, description of it is skipped.

The control circuit 100 includes a switching transistor M1, a pulse generation portion 10 and a driver circuit 20, and is integrated unitarily on one semiconductor substrate. The words "unitary integration" covers a case where all constituent elements of a circuit are formed on a semiconductor substrate and a case where main constituent elements of a circuit are unitarily integrated, and part of resistors and capacitors may be disposed outside a semiconductor substrate for circuit constant adjustment.

A switching terminal (SW terminal) of the control circuit 100 is connected to the inductor L1. The switching transistor M1 is disposed between the SW terminal and a ground terminal. The output voltage $V_{OUT}$ from the switching regulator 2 is divided by a first resistor R1 and a second resistor R2, whereby a feedback voltage $V_{FB}$ is generated. The feedback voltage $V_{FB}$ proportional to the output voltage $V_{OUT}$ is input to a feedback terminal (FB terminal) of the control circuit 100.

The pulse signal generation portion 10 generates a pulse signal $S_{PWM}$ whose duty ratio is adjusted such that the feedback voltage $V_{FB}$ becomes equal to a predetermined reference voltage $V_{REF}$. The pulse signal generation portion 10 may be composed by using a publicly known pulse width modulator, a pulse frequency modulator and the like, and is not especially limited.

The driver circuit 20 drives the switching transistor M1 in accordance with the pulse signal $S_{PWM}$. A setting terminal ADJ of the control circuit 100 is disposed to set a transition time of a gate signal $V_G$ of the switching transistor M1. In the control circuit 100 in FIG. 2, both of a rise time span $T_R$ and a fall time span $T_F$ of the gate signal are able to be from outside.

The driver circuit 20 includes: a high-side transistor M2; a low-side transistor M3; a high-side variable current source 22; a low-side variable current source 24; and a slew rate control portion 30.

The high-side transistor M2 is disposed between a power supply terminal $P_{VDD}$, to which a power supply voltage $V_{DD}$ for the control circuit 100 is applied, and a gate of the switching transistor M1. The low-side transistor M3 is disposed between the gate of the switching transistor M1 and the ground terminal.

The high-side variable current source 22 is disposed in series with the high-side transistor M2 between the power supply terminal $P_{VDD}$ and the gate of the switching transistor M1. The low-side variable current source 24 is disposed in series with the low-side transistor M3 between the gate of the switching transistor M1 and the ground terminal. The pulse signal $S_{PWM}$ is input to gates of the high-side transistor M2 and the low-side transistor M3. The high-side transistor M2 and the low-side transistor M3 are switched to be turned on/off in a complementary manner.

The slew rate control portion 30, in accordance with an electric state of the setting terminal ADJ, controls an electric current amount $I_H$ of the high-side variable current source 22 and a an electric current amount $I_L$ of the low-side variable current source 24.

Figure 3:
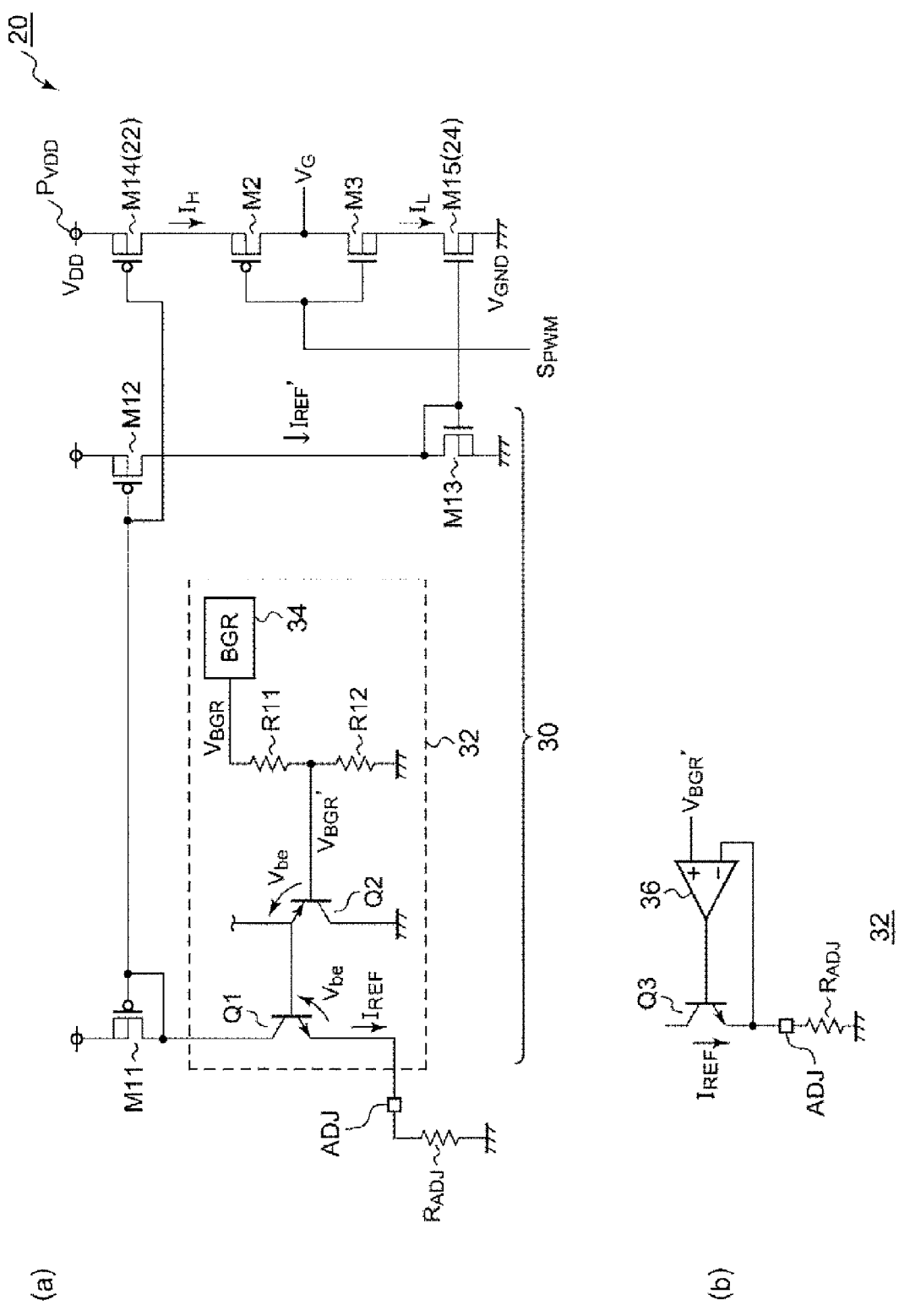
FIGS. 3 (a) and (b) are each a circuit diagram showing a structural example of a driver circuit.

FIGS. 3 (a) and (b) are each a circuit diagram showing a structural example of the driver circuit 20. The slew rate control portion 30 in FIG. 3 (a) includes a reference current source 32, and transistors M11 to M13.

The reference current source 32 generates a reference current $I_{REF}$ in accordance with the state of the setting terminal ADJ. An adjustment resistor $R_{ADJ}$ is externally connectable to the setting terminal ADJ. The reference current source 32 includes: a first bipolar transistor Q1; a second bipolar transistor Q2; a band gap reference circuit 34; resistors R11 and R12. The band gap reference circuit 34 generates a predetermined reference voltage $V_{BGR}$. The reference voltage $V_{BGR}$ is divided by the resistors R11 and R12.

An emitter of the first bipolar transistor Q1 of NPN type is connected to the setting terminal ADJ. An emitter of the second bipolar transistor Q2 of PNP type is connected to a base of the first bipolar transistor Q1. A divided reference voltage $V_{BGR}'$ is input to a base of the second bipolar transistor Q2. The emitter of the second bipolar transistor Q2 is connected to a circuit that supplies an emitter current for the second bipolar transistor Q2 and a base current for the first bipolar transistor Q1, the structure of the circuit is not especially limited, accordingly, is not shown.

Assuming that base-emitter voltages Vbe of the first bipolar transistor Q1 and the second bipolar transistor Q2 are equal to each other, the voltage at the setting terminal ADJ becomes equal to the reference voltage $V_{BGR}'$. Accordingly, the reference current IREF given by the following formula (1) flows in the adjustment resistor $R_{ADJ}$ via the first bipolar transistor Q1.

$$I_{REF} = V_{BGR}'/R_{ADJ} \quad (1)$$

The reference current source 32 outputs a current flowing in the first bipolar transistor Q1 as the reference current $I_{REF}$.

The high-side variable current source 22 generates the current $I_H$ proportional to the reference current $I_{REF}$. The transistor M11 of the slew rate control portion 30 is disposed on a route for the reference current $I_{REF}$ on a collector side of the first bipolar transistor Q1. The high-side variable current source 22 includes a transistor M14 that composes a current mirror circuit together with the input transistor M11. According to this, the current $I_H$ proportional to the reference current $I_{REF}$ flows in the transistor M14.

Likewise, the low-side variable current source 24 generates the current $I_L$ proportional to the reference current $I_{REF}$. The transistor M12 composes a current mirror circuit together with the transistor M11, and generates a current $I_{REF}'$ in accordance with the reference current $T_{REF}$. The transistor M13 is disposed on a route for the current $I_{REF}'$. The low-side variable current source 24 includes a transistor M15 that is connected to compose a current mirror circuit together with the transistor M13. According to this, the current $I_L$ proportional to the reference current $I_{REF}'$ (and the reference current $I_{REF}$) flows in the transistor M15.

FIG. 3 (b) shows another structural example of the reference current source 32. The reference current source 32 includes a third transistor Q3 and an operational amplifier 36. The third transistor Q3 is disposed on a route for the adjustment resistor $R_{ADJ}$, and its control terminal (base) is connected to an output terminal of the operational amplifier 36. The reference voltage $V_{BGR}'$ is input to one input terminal (non-inverting input terminal) of the operational amplifier 36, while a potential at a connection point between the third transistor Q3 and the resistor $R_{ADJ}$ is fed back to the other input terminal (inverting terminal).

The structure of the control circuit 100 is as described above. Next, its operation is described.

The switching transistor M1 is turned off when the gate signal is at a low level (ground voltage) and turned on when the gate signal is at a high level (power supply voltage $V_{DD}$). When switching the switching transistor M1 from the turning-off to the turning-on, the driver circuit 20 turns off the low-side transistor M3 and turns on the high-side transistor M2, and charges the gate of the switching transistor M1 to step up the gate voltage $V_G$. A step-up speed (slew rate) at this time becomes faster as the electric current value $I_H$ of the high-side variable current source 22 becomes larger, and the transition time $T_R$ becomes shorter.

In contrast, when switching the switching transistor M1 from the turning-on to the turning-off, the driver circuit 20 turns on the low-side transistor M3 and turns off the high-side transistor M2, and discharges the gate of the switching transistor M1 to step down the gate voltage $V_G$. A step-down speed (slew rate) at this time becomes faster as the electric current value $I_L$ of the low-side variable current source 24 becomes larger, and the transition time $T_F$ becomes shorter.

As described above, the electric current values $I_H$ and $I_L$ of the high-side variable current source 22 and the low-side variable current source 24 are variable in accordance with the electric state of the setting terminal ADJ. Accordingly, according to the control circuit 100 in FIG. 2 and FIG. 3, it is possible to change the transition times $T_R$ and $T_F$ of the gate signal $V_G$.

The designer of the electronic appliance 1 that incorporates the switching regulator 2 connects the adjustment resistor $R_{ADJ}$, which has a value, to the setting terminal ADJ, and operate the switching regulator 2. At this time, if the EMI specifications are met, the adjustment resistor $R_{ADJ}$ is replaced with a resistor having a smaller resistance value, whereby it is possible to shorten the transition times $T_R$ and $T_F$ of the gate signal $V_G$ and raise the efficiency. In contrast, if the EMI specifications are not met at a resistance value, the adjustment resistor $R_{ADJ}$ is replaced with a resistor having a larger resistance value, whereby it is possible to prolong the transition times $T_R$ and $T_F$ of the gate signal $V_G$ and reduce the EMI.

As described above, according to the control circuit 100, even after the control circuit 100 is produced, the transition times $T_R$ and $T_F$ of the gate signal are variable, accordingly, it is possible to achieve the maximum efficiency for every set in a range where the EMI specifications are met.

Hereinbefore, the present invention is described based on the embodiment. This embodiment is an example, it is understandable for those skilled in the art that a combination of each constituent element and each manipulation process is variously modifiable and such modifications are covered by the scope of the present invention. Hereinafter, such modifications are described.

Figure 4:
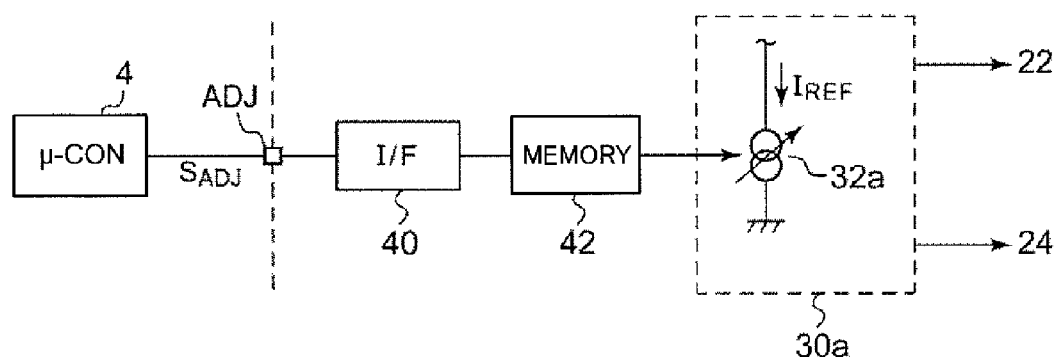
FIG. 4 is a circuit diagram showing a structure of a control circuit according to a modification.

FIG. 4 is a circuit diagram showing a structure of a control circuit 100a according to a modification. The control circuit 100a includes: an interface circuit 40; a memory 42; and a slew rate control portion 30a. A control signal $S_{ADJ}$ for specifying the transition times $T_R$ and $T_F$ of the gate signal $V_G$ of the switching transistor M1 is able to be input to the setting terminal ADJ for a microcomputer 4, for example. The interface circuit 40 writes the received control signal S into the memory 42 that is a register or a non-volatile memory. The slew rate control portion 30a sets the electric current amounts $L_H$ and $I_L$ of the high-side variable current source 22 and the low-side variable current source 24.

For example the slew rate control portion 30a includes a reference current source 32a that generates the reference current $I_{REF}$ in accordance with the control signal $S_{ADJ}$. A structure of the reference current source 32a is not especially limited. A structure of the slew rate control portion 30a may be the same as FIG. 3 (a) except for the reference current source 32a.

Even in the modification in FIG. 4, the same effects as the control circuit 100 in FIG. 3 (a) are obtainable.

A control voltage for specifying the electric current amounts $I_H$ and $I_L$ may be input to the setting terminal ADJ from outside. In this case, the slew rate control portion generates a reference current proportional to the control voltage. Specifically, in the slew rate control portion in FIGS. 3 (a) and (b), the adjustment resistor $R_{ADJ}$ is incorporated in the control circuit 100, and the reference voltage $V_{BGR}$ or $V_{BGR}'$ is input to the setting terminal ADJ from outside.

In the embodiment, the case is described, in which the rise time $T_R$ and the fall time $T_F$ are controlled in accordance with the specifying through the setting terminal ADJ; however, these may be set independently. In the control circuit 100 in FIG. 3 (a), two pairs of the setting terminal ADJ and the reference current source 32 are disposed, one pair of which is used to set the electric current value $I_H$ of the high-side variable current source 22, while the other pair of which is used to set the electric current value $I_L$ of the low-side variable current source 24.

In the control circuit 100a in FIG. 4, the control signal $S_{ADJ}$ contains first data for specifying the rise time $T_R$ and second data for specifying the fall time $T_F$, and two reference current sources 32a are disposed. And, a reference current in accordance with the first data is generated by means of the first reference current source 32a and the electric current value $I_H$ of the high-side variable current source 22 is set, while a reference current in accordance with the second data is generated by means of the second reference current source 32a and the electric current value $I_L$ of the high-side variable current source 24 is set.

In the embodiment, the case is described, in which both of the rise time $T_R$ and the fall time $T_F$ are variable; however, only one of them may be made variable. In a case where only the rise time $T_R$ is made variable, the low-side variable current source 24 is removed or the electric current value $I_L$ generated by the low-side variable current source 24 is fixed. In contrast, in a case where only the fall time $T_F$ is made variable, the high-side variable current source 22 is removed or the electric current value $I_H$ generated by the high-side variable current source 22 is fixed.

In the circuit diagrams shown in the embodiment, the MOSFET (Metal Oxide Semiconductor Field Effect Transistor) and the bipolar transistor are replaceable with each other when necessary. And, a structure is also effective, in which the NPN type and the PNP type are replaced with each other; the N channel and the P channel are replaced with each other; and disposed upside down.

In the embodiment, the switching regulator of voltage step-up type is described as an example; however, the present invention is also applicable to a voltage step-down type or a voltage step-up/-down type, and these are covered by the scope of the present invention.

Based on the embodiment, the present invention is described by using the specific terms; however, the embodiment describes only the principle and applications, and in the embodiment, many modifications and layout changes are permissible in the scope that does not depart the concept of the present invention defined by the claims.

Switching Power Supply Device

First Embodiment

Figure 5:
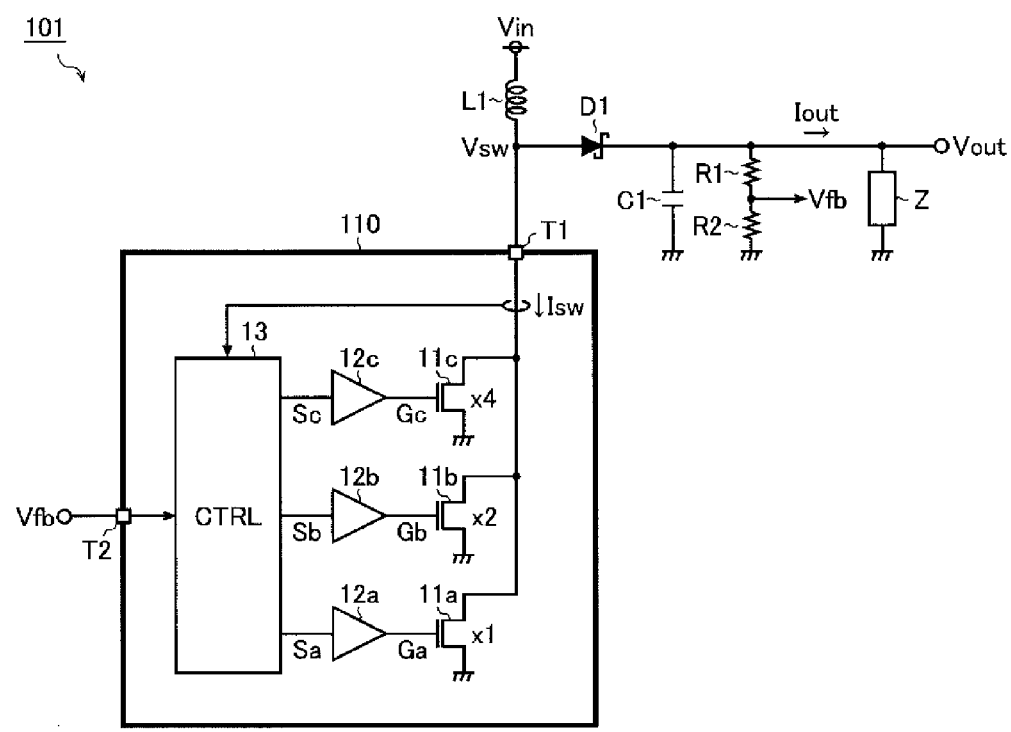
FIG. 5 is a diagram showing a first embodiment of a switching power supply device.

FIG. 5 is a diagram showing a first embodiment of a switching power supply device. The switching power supply device 101 according to the first embodiment is a switching regulator of voltage step-up type that besides a semiconductor integrated circuit device 110, includes, as discrete devices connected to the semiconductor integrated circuit device, a coil L1; a Schottky barrier diode D1; a capacitor C1; resistors R1 and R2.

Outside the semiconductor integrated circuit device 110, a first terminal of the coil L1 is connected to an application terminal of an input voltage Vin. A second terminal of the coil L1 is connected to a switch terminal T1 (application terminal of a switch voltage $V_{SW}$) of the semiconductor integrated circuit device 110 and also connected to an anode of the Schottky barrier diode D1. A cathode of the Schottky barrier diode D1 is connected to an application terminal of an output voltage Vout. The capacitor C1 is connected between the application terminal of the output voltage Vout and the ground terminal. The resistors R1 and R2 are connected in series with each other between the application terminal of the output voltage Vout and the ground terminal. A connection node between the resistors R1 and R2 is connected to a feedback terminal T1 (application terminal of a feedback voltage Vfb) of the semiconductor integrated circuit device 110. A load Z is connected between the application terminal of the output voltage Vout and the ground terminal.

The semiconductor integrated circuit device 110 is a so-called switching power supply IC, and includes: output transistors 11a to 11c; drivers 12a to 12c; and a control portion 13. Here, in the semiconductor integrated circuit device 110, besides the above circuit blocks, a protection circuit block and the like may be built in when necessary.

The output transistors 11a to 11c are all a MOS [metal oxide semiconductor] transistor of N channel type. Drains of the output transistors 11a to 11c are 11c are all connected to the switch terminal T1. Sources of the output transistors 11a to 11c are 11c are all connected to the ground terminal. Gates of the output transistors 11a to 11c are connected to output terminals of the drivers 12a to 12c, respectively. In this way, the output transistors 11a to 11c are connected in parallel with one another.

Besides, the output transistors 11a to 11c are designed to have sizes (occupation area on the semiconductor chip) that are different from one another. More specifically, in a case where the size of the output transistor 11a is defined as "×1," the size of the output transistor 11b is "×2," and the size of the output transistor 11c is "×4." According to such a structure, by switching the output transistors 11a to 11c to target a transistor for driving (on/off control target), when regarding each of the output transistors 11a to 11c as one output transistor, the size is switchable in seven ways.

If any one of the output transistors 11a to 11c is turned on and the others are turned off, one output transistor having the size "×1," "×2," or "×4" is achievable as a whole. If the output transistors 11a and 11b are turned on the same time and the output transistor 11c is turned off, one output transistor having the size "×3" is achievable as a whole. If the output transistors 11a and 11c are turned on at the same time and the output transistor 11b is turned off, one output transistor having the size "×5" is achievable as a whole. If the output transistors 11b and 11c are turned on at the same time and the output transistor 11a is turned off, one output transistor having the size "×6" is achievable as a whole. If the output transistors 11a to 11c are all turned on, one output transistor having the size "×7" is achievable as a whole. However, the sizes of the output transistors 11a to 11c are not limited to the above sizes, and may be designed to have the same size as one another.

The divert drivers-12a to 12c generate gate signals Ga to Gc respectively that have raised electric current capabilities of on/off control signals Sa to Sc which are input from the control portion 13, and supply them to the output transistors 11a to 11c, respectively.

The control portion 13 generates the on/off control signals Sa to Sc for the output transistors 11a to 11c at a predetermined frequency such that the desired output voltage Vout is generated from the input voltage Vin and is supplied to the load Z. Besides, the control portion 13 has a function to decide a drive-target output transistor based on a weight of the load Z. Here, to detect the weight of load Z, the control portion 13 may be structured to monitor an output current Tout flowing in the load Z or a current or a voltage (a switch current $I_{SW}$ or a switch voltage $V_{SW}$ appearing at the switch terminal) equivalent to the output current. Or, to detect the weight of the load Z, the control portion 13 may be structured to receive an information signal about the weight of the load Z from a main controller (not shown) of an application which incorporates the switching power supply device 101.

First, basic operation (d.c./d.c. conversion operation) of the switching power supply device 101 having the above structure is described. In the meantime, hereinafter, for the sake of convenience, a case is described, as an example, in which only the output transistor 11a is the drive target; however, in accordance with a combination of the drive-target output transistors, the reference number in the description is replaceable to read "11b," "11c," "11a and 11b," "11a and 11c," "11b and 11c," or "11a to 11c."

If the output transistor 11a is brought into the on state, the switch current $I_{SW}$ flows through the coil L1 to the ground terminal via the output transistor 11a and electric energy is accumulated. Here, in a case where charges are already accumulated in the capacitor C1 during an on time span of the transistor 11a, the output current Tout flows into the load Z from the capacitor C1. At this time, a potential at the switch terminal T1 drops substantially to a ground potential via the transistor 11a, accordingly, the Schottky barrier diode D1 goes into a reverse bias state, whereby a current does not flow from the capacitor C1 to the transistor 11a. On the other hand, if the transistor 11a is brought into the off state, the electric energy accumulated in the coil L1 is emitted thanks to a counter electromotive voltage that occurs in the coil L1. At this time, the Schottky barrier diode D1 goes into a forward bias state, accordingly, a current flowing via the Schottky barrier diode D1 flows into the load Z as the output current Iout and flows into the ground terminal via the capacitor C1 to charge the capacitor C1. The above operation is repeated, whereby the output voltage Vout obtained by stepping up the input voltage Vin is supplied to the load Z.

As described above, the semiconductor integrated circuit device 110 drives the coil L1, an energy storage device, by means of the on/off control of the transistors 11a to 11c, thereby functioning as a constituent element of the switching regulator of voltage step-up type that steps up the input voltage Vin to generate the output voltage Vout.

Next, output transistor switch control by the control portion 13 is described. In a light load region where the switch current $I_{SW}$ becomes small, a loss ($=f \times Cgs \times Vgs^2$) due to charge and discharge of a parasitic capacitance Cgs present between a gate and a source of the output transistor becomes prevailing more than a loss ($=I_{SW}^2 \times Ron$) due to an on resistance Ron of the output transistor (f is a switching frequency, and Vgs is a gate-source voltage of the output transistor). Accordingly, in the light load region, it is desirable to use a small-sized output transistor whose parasitic capacitance Ggs is small. On the other hand, in a heavy load region, the loss due to the on-resistance Ron of the output transistor becomes prevailing, accordingly, it is desirable to use a large-sized output transistor whose on-resistance Ron is small.

In light of the above knowledge, the control portion 13 decides the drive-target output transistor such that as the load Z becomes heavier (the switch current $I_{SW}$ is large), the transistor size becomes larger; and as the load Z becomes lighter (the switch current $I_{SW}$ is small), the transistor size becomes smaller.

Figure 6:
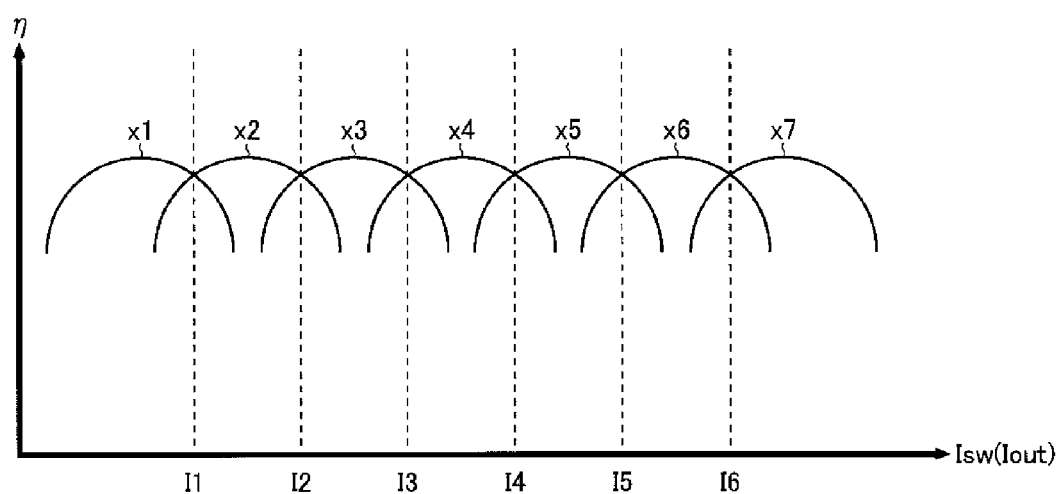
FIG. 6 is a diagram showing an example of output transistor switching control.

FIG. 6 is a diagram showing an example of the output transistor switching control. A horizontal axis indicates the switch current $I_{SW}$ (equivalent to the output current Iout), while the vertical axis indicates the efficiency η of the switching power supply device 1. Here, a first threshold value current I1 to a sixth threshold value current I6 are set to meet I1<I2<I3<I4<I5<I6.

As shown in FIG. 6, when the switch current $I_{SW}$ is smaller than the first threshold value current I1, only the output transistor 11a is targeted for driving and the output transistor having the size "×1" is achieved. When the switch current $I_{SW}$ is larger than the first threshold value current I1 and smaller than the second threshold value current I2, only the output transistor 11b is targeted for driving and the output transistor having the size "×2" is achieved. When the switch current $I_{SW}$ is larger than the second threshold value current I2 and smaller than the third threshold value current I3, the output transistors 11a and 11b are targeted for driving and the output transistor having the size "×3" is achieved. When the switch current $I_{SW}$ is larger than the third threshold value current I3 and smaller than the fourth threshold value current I4, only the output transistor 11c is targeted for driving and the output transistor having the size "×4" is achieved. When the switch current $I_{SW}$ is larger than the fourth threshold value current I4 and smaller than the fifth threshold value current I5, the output transistors 11a and 11c are targeted for driving and the output transistor having the size "×5" is achieved. When the switch current $I_{SW}$ is larger than the fifth threshold value current I5 and smaller than the sixth threshold value current I6, the output transistors 11b and 11c are targeted for driving and the output transistor having the size "×6" is achieved. When the switch current $I_{SW}$ is larger than the sixth threshold value current I6, the output transistors 11a to 11c are all targeted for driving and the output transistor having the size "×7" is achieved.

As described above, according to the structure in which the transistor size is switched in accordance with the weight of the load Z, it becomes possible to achieve high efficiency in a wide load region which ranges from the heavy load region to the light load region without causing a change in the switching frequency.

Here, in the above description, the structure is described as an example, in which the switch current $I_{SW}$ is monitored to perform the output transistor switch control; however, the control portion 13 is also able to target the switch voltage $V_{SW}$ for the monitoring instead of the switch current $I_{SW}$. Hereinafter, a structure is described, in which the switch voltage $V_{SW}$ is monitored to perform the output transistor switch control.

Figure 7:
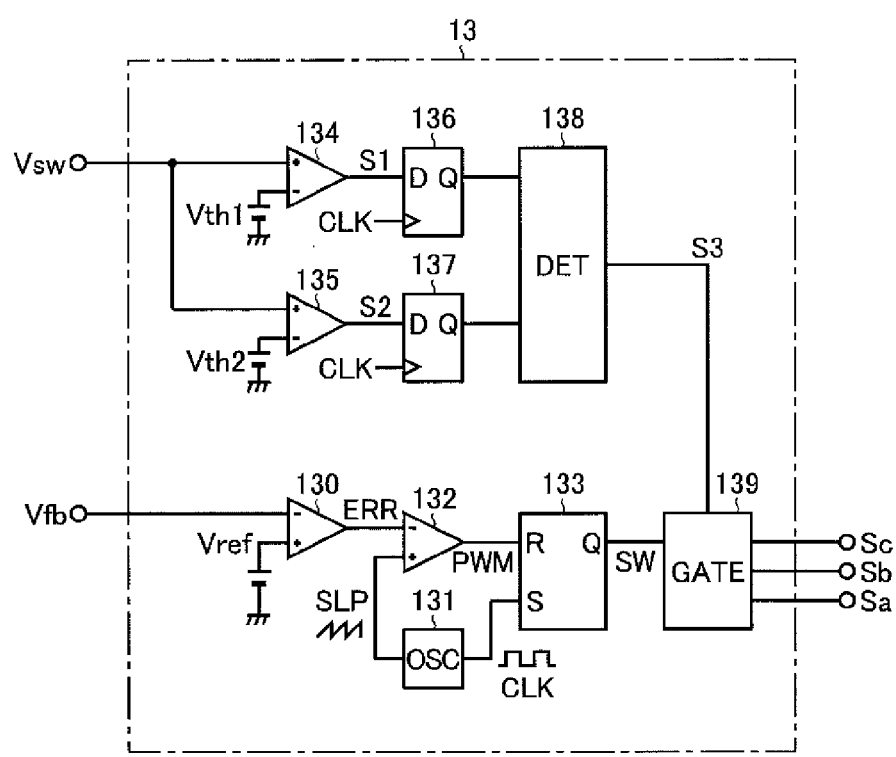
FIG. 7 is a diagram showing a structural example of a control portion 13.

FIG. 7 is a diagram showing a structural example of the control portion 13 that monitors the switch voltage $V_{SW}$ to perform the output transistor switch control. The control portion 13 in the present structural example includes: an error amplifier 130; an oscillator 131; a comparator 132; an RS flip-flop 133; comparators 134 and 135; D flip-flops 136 and 137; a determination portion 138; and a signal gate portion 139.

The error amplifier 130 amplifies a difference between the feedback voltage Vfb (a divided voltage of the output voltage Vout) applied to an inverting input terminal (−) and a predetermined reference voltage Vref (corresponding to a target set value of the output voltage Vout) applied to a non-inverting input terminal (+), thereby generating an error signal ERR. A voltage value of the error signal ERR becomes larger as the feedback voltage Vfb becomes lower than the reference voltage Vref.

The oscillator 131 generates a rectangular wave-shaped clock signal CLK and a saw tooth-shaped (or triangular wave-shaped) slope signal SLP at a predetermined switching frequency f.

The comparator 132 compares the error signal ERR applied to an inverting input terminal (−) and the slope signal SLP applied to a non-inverting input terminal (+), thereby generating a comparison signal PWM (a pulse width modulation signal having a duty in accordance with the comparison result). The comparison signal PWM goes to a high level if the error signal ERR is higher than the slope signal SLP, and goes to a low level the error signal ERR is lower than the slope signal SLP. Accordingly, an on duty (a percentage of an on time span of the output transistor occupying in a switching period) of the comparison signal PWM changes in accordance with the voltage value of the error signal ERR.

The RS flip-flop outputs an on/off control signal SW from an output terminal (Q) based on the comparison signal PWM applied to a reset input terminal (R) and the clock signal CLK applied to a set input terminal (S). The on/off control signal SW is set to the high level at a rising edge of the clock signal CLK and reset to the low level at a rising edge of the comparison signal PWM.

The comparator 134 compares the switch voltage $V_{SW}$ applied to a non-inverting input terminal (+) and a first threshold value voltage Vth1 applied to an inverting input terminal (−), thereby generating a first comparison signal S1. The first comparison signal S1 goes to the high level if the switch voltage $V_{SW}$ is higher than the first threshold voltage Vth1, and goes to the low level if the switch voltage $V_{SW}$ is lower than the first threshold voltage Vth1.

The comparator 135 compares the switch voltage $V_{SW}$ applied to a non-inverting input terminal (+) and a second threshold value voltage Vth2 (where Vth2<Vth1) applied to an inverting input terminal (−), thereby generating a second comparison signal S2. The second comparison signal S2 goes to the high level if the switch voltage $V_{SW}$ is higher than the second threshold voltage Vth2, and goes to the low level if the switch voltage $V_{SW}$ is lower than the second threshold voltage Vth2.

The D flip-flop 136 latches the first comparison signal S1 applied to a data input terminal (D) at a rising edge of the clock signal CLK (or of its delayed signal). In other words, the D flip-flop 136 functions as a first latch that latches the first comparison signal S1 when the drive-target output transistor is in the on state. In other words, the first comparison signal S1 latched by the D flip-flop 136 corresponds to a comparison result of the low level (=Ron>$I_{SW}$) of the switch voltage $V_{SW}$ with the first threshold value voltage Vth1.

The D flip-flop 137 latches the second comparison signal S2 applied to a data input terminal (D) at a rising edge of the clock signal CLK (or of its delayed signal). In other words, the D flip-flop 137 functions as a second latch that latches the second comparison signal S2 when the drive-target output transistor is in the on state. In other words, the second comparison signal S2 latched by the D flip-flop 137 corresponds to a comparison result of the low level (=Ron×$I_{SW}$) of the switch voltage $V_{SW}$ with the second threshold value voltage Vth2.

Based on the first comparison signal S1 latched by the D flip-flop 136 and the second comparison signal S2 latched by the D flip-flop 137, the determination portion 138 generates a switch signal S3 for deciding the drive-target output transistor and outputs the switch signal to the signal gate portion 139.

Figure 8:
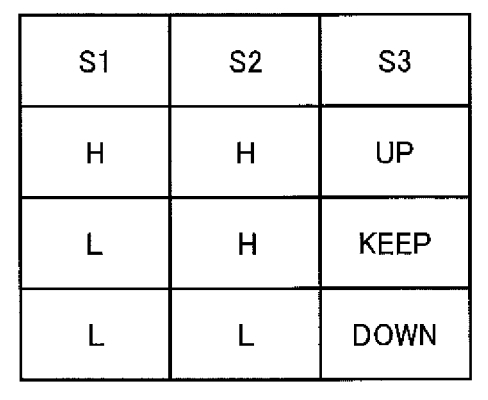
Figure 9:
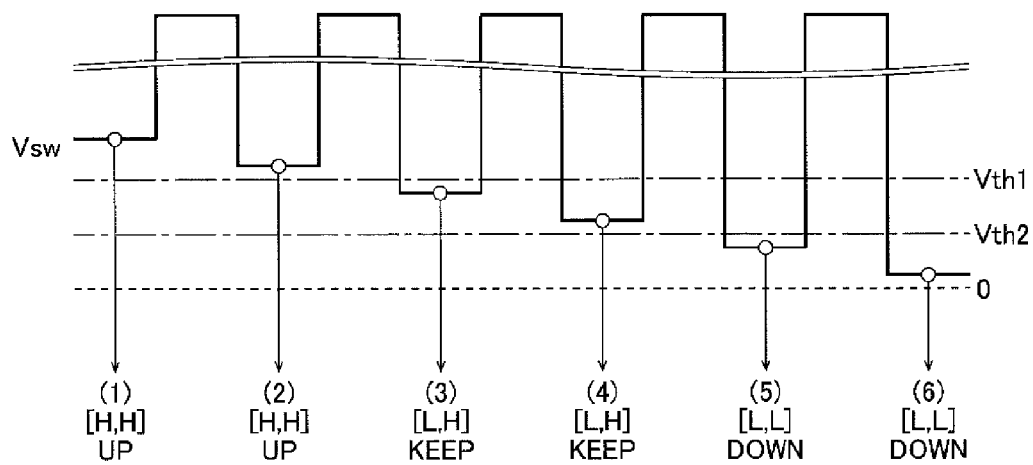
FIG. 9 is a diagram showing a relationship between a switch voltage $V_{SW}$ and output transistor switching control.

Specifically, when the low level of the switch voltage $V_{SW}$ is higher than the first threshold value voltage Vth1, that is, when the both of the first comparison signal S1 and the second comparison signal S2 are at the high level, the switch signal S3 for UP specifying is generated (see a top stage in FIG. 8, or timings (1) and (2) in FIG. 9) such that the transistor size is made larger by one step from present. Besides, when the low level of the switch voltage $V_{SW}$ is lower than the first threshold value voltage Vth1 and higher than the second threshold value voltage Vth2, that is, when the first comparison signal S1 is at the low level and the second comparison signal S2 is at the high level, the switch signal S3 for KEEP specifying is generated (see a middle stage in FIG. 8, or timings (3) and (4) in FIG. 9) such that the transistor size is kept at the present. Besides, when the low level of the switch voltage $V_{SW}$ is lower than the second threshold value voltage Vth2, that is, when both of the first comparison signal S1 and the second comparison signal S2 is at the low level, the switch signal S3 for DOWN specifying is generated (see a bottom stage in FIG. 8, or timings (5) and (6) in FIG. 9) such that the transistor size is made smaller by one step from the present.

The signal gate portion 139 switches a supply destination of the on/off control signal SW in accordance with the switch signal S3 input from the determination portion 138. For example, in a case where the switch signal S3 for the UP specifying is input when the output transistor having the size "×3" is achieved, the supply destination of the on/off control signal SW is changed such that the output transistor having the size "×4" is achieved. On the other hand, in a case where the switch signal S3 for the DOWN specifying is input when the output transistor having the size "×3" is achieved, the supply destination of the on/off control signal SW is changed such that the output transistor having the size "×2" is achieved. Besides, in a case where the switch signal S3 for the KEEP specifying is input when the output transistor having the size "×3" is achieved, the supply destination of the on/off control signal SW is not changed but kept.

Even in a case where the switch signal S3 for the UP specifying, the DOWN specifying, or the KEEP specifying is input when an output transistor having anther size is achieve, basically, the supply destination of the on/off control signal SW is decided based on the same way as the above description. However, in a case where the switch signal S3 for the UP specifying is input when the output transistor having the size "×7" is achieved, a further size up is impossible, accordingly, the supply destination of the on/off control signal SW is not changed but kept. Likewise, in a case where the switch signalS3 for the DOWN specifying is input when the output transistor having the size "×1" is achieved, a further size down is impossible, accordingly, the supply destination of the on/off control signal SW is not changed but kept.

Besides, when only the output transistor 11a is targeted for driving and the output transistor having the size "×1" is achieved, the on/off control signal SW is output as an on/off control signal Sa, and on/off control signals Sb and Sc are fixed at the low level. When only the output transistor 11b is targeted for driving and the output transistor having the size "×2" is achieved, the on/off control signal SW is output as the on/off control signal Sb, and the on/off control signals Sa and Sc are fixed at the low level. When the output transistors 11a and 11b are targeted for driving and the output transistor having the size "×3" is achieved, the on/off control signal SW is output as the on/off control signals Sa and Sb, and the on/off control signals Sc is fixed at the low level. When only the output transistor 11c is targeted for driving and the output transistor having the size "×4" is achieved, the on/off control signal SW is output as the on/off control signals Sc, and the on/off control signals Sa and Sb are fixed at the low level. When the output transistors 11a and 11c are targeted for driving and the output transistor having the size "×5" is achieved, the on/off control signal SW is output as the on/off control signals Sa and Sc, and the on/off control signals Sb is fixed at the low level. When the output transistors 11b and 11c are targeted for driving and the output transistor having the size "×6" is achieved, the on/off control signal SW is output as the on/off control signals Sb and Sc, and the on/off control signals Sa is fixed at the low level. When the output transistors 11a to 11c are all targeted for driving and the output transistor having the size "×7" is achieved, the on/off control signal SW is output as the on/off control signals Sa to Sc.

As described above, the control portion 13 in the present structural example monitors the rectangular wave-shaped switch voltage $V_{SW}$ generated by performing the on/off control of the drive-target output transistor, and decides the drive-target output transistor based on the comparison results of the switch voltage $V_{SW}$ (i.e., the low level of the switch voltage $V_{SW}$) detected when the drive-target output transistor is in the on state with the predetermined threshold value voltages Vth1 and Vth2. According to such a structure, it becomes possible to suitably switch the transistor size in accordance with the weight of the load Z despite the very simple circuit structure.

Second Embodiment

Figure 10:
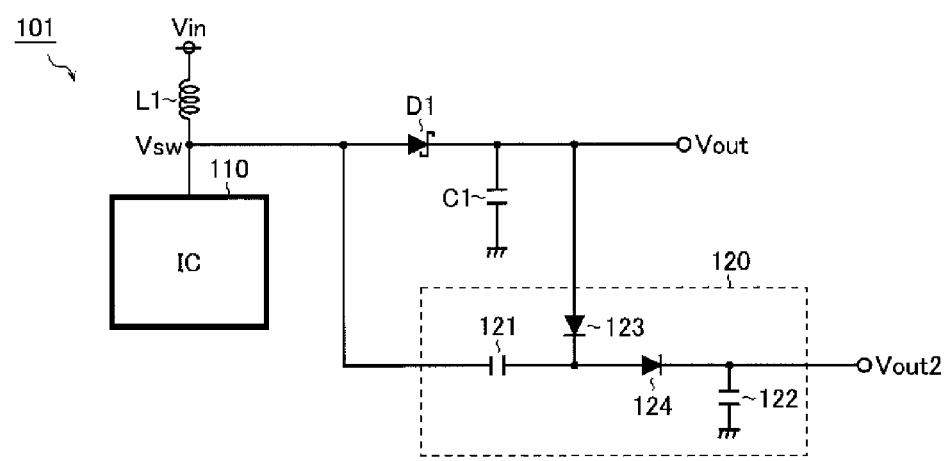
FIG. 10 is a diagram showing a second embodiment of a switching power supply device.
Figure 11:
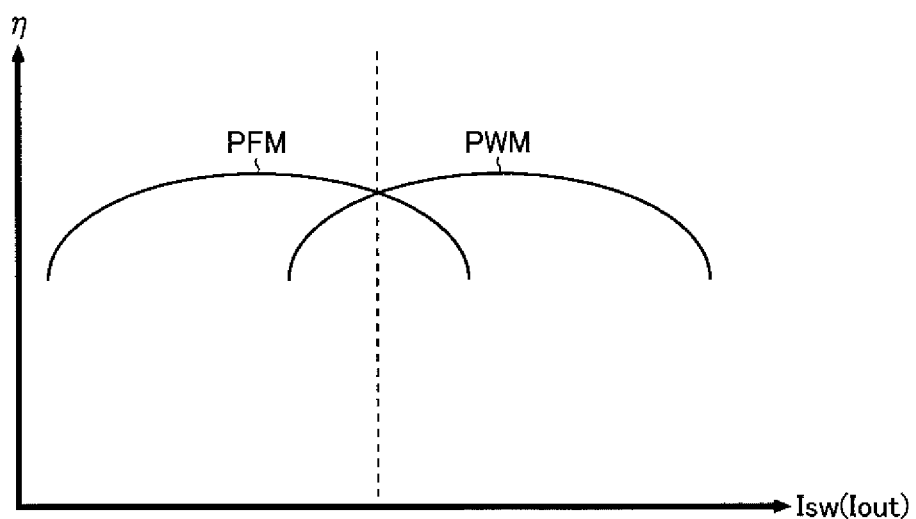
FIG. 11 is a diagram showing an example of PWM/PFM switching control.

FIG. 10 is a diagram showing a second embodiment of the switching power supply device. The switching power supply device 101 according to the second embodiment has substantially the same structure as the first embodiment, and has a feature of further having a charge pump circuit 120. Because of this, the same constituent elements as the first embodiment are indicated by the same reference numbers as FIG. 5, double description is skipped, and hereinafter, description is performed focusing on feature points of the second embodiment.

The charge pump circuit 120 is a circuit block that steps up the output voltage Vout by using the switch voltage $V_{SW}$ to generate a second output voltage Vout2, and includes capacitors 121 and 122 and diodes 123 and 124.

A first terminal of the capacitor 121 is connected to an application terminal of the switch voltage $V_{SW}$. A second terminal of the capacitor 121 is connected to a cathode of the diode 123 and to an anode of the diode 124. An anode of the diode 123 is connected to the application terminal of the output voltage Vout. A cathode of the diode 124 is connected to an application terminal of the second output voltage Vout2. The capacitor 122 is connected between the application terminal of the second output voltage Vout2 and the ground terminal.

During a low level time span of the switch voltage $V_{SW}$, a charge current flows from the application terminal of the output voltage Vout to the application terminal of the switch voltage $V_{SW}$ via the diode 123 and the capacitor 121. At this time, a voltage across the capacitor 121 becomes substantially equal to the output voltage Vout. Thereafter, during a high level time span of the switch voltage $V_{SW}$, if the first terminal of the capacitor 121 is boosted in voltage nearly to the input voltage Vin, the second terminal of the capacitor 121 also is boosted in voltage to (Vout+Vin) thanks to charge conservation of the capacitor 121, and the capacitor 122 is charged via the diode 124. The above operation is repeated, whereby the second output voltage Vout2 obtained by further stepping up the output voltage Vout.

According to the switching power supply device 101 according to the second embodiment, when achieving high efficiency in a wide load region, it is possible to keep the switching frequency constant, accordingly, it becomes possible to stably operate the charge pump circuit 120 that uses the switch voltage $V_{SW}$.

Third Embodiment

Figure 12:
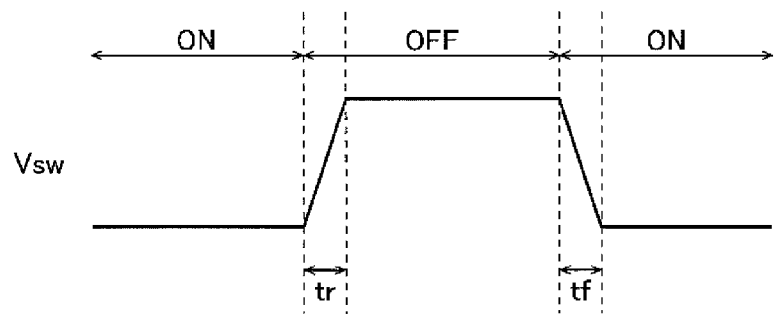
FIG. 12 is a diagram for describing a slew rate of an output transistor.

Next, as a circuit characteristic related to the efficiency of the switching power supply device, a slew rate of the output transistor is focused on. FIG. 12 is a diagram for describing the slew rate of the output transistor. To raise the efficiency of the switching power supply device, it is necessary to set the slew rate of the output transistor at a large value and shorten a rising time span tr and a falling time span tf of the switch voltage $V_{SW}$. However, if a large slew rate of the output transistor is set, the occurrence amount of electro-magnetic noise ([EMI] noise) increases. Because of this, considering a tradeoff between the efficiency of the switching power supply device and the occurrence amount of electro-magnetic noise, it is important to adjust the slew rate of the output transistor at the optimum value.

FIG. 8 is a diagram showing a third embodiment of the switching power supply device. The switching power supply device 101 according to the third embodiment is a switching regulator of voltage step-up type that besides a semiconductor integrated circuit device 110, includes, as discrete devices connected to the semiconductor integrated circuit device, the coil L1; the Schottky barrier diode D1; the capacitor C1; the resistors R1 and R2. Here, a connection relationship among the discrete devices is the same as the first embodiment and the second embodiment, accordingly, double description is skipped.

The semiconductor integrated circuit device 110 is a so-called switching power supply IC, and includes: an output transistor 11; a driver 12; the control portion 13; and an enable logic portion 14. Here, in the semiconductor integrated circuit device 110, besides the above circuit blocks, a protection circuit block and the like may be built in when necessary.

The output transistor 11 is a MOS field effect transistor of N channel type. A drain of the output transistor 11 is connected to the switch terminal T1. A source of the output transistor 11 is connected to the ground terminal. A gate of the output transistor 11 is connected to an output terminal of the driver 12.

Figure 14:
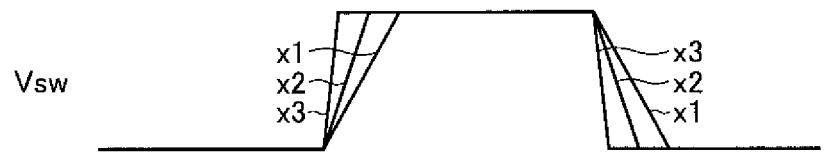
FIG. 14 is a diagram showing an adjustment example of a slew rate.

The driver 12 generates a gate signal G, which has a raised electric capability of the on/off control signal S input from the control portion 13, and outputs the gate signal to the output transistor 11. The driver 12 includes unit drivers 12x to 12z. The unit drivers 12x to 12z are each connected in parallel with a signal output terminal of the control portion 13 and the gate of the output transistor 11. The unit drivers 12x to 12z are independently controlled to or not to operate in accordance with enable signals ENx to ENz. The unit drivers 12x to 12z are formed of transistors that have the same size as one another. By switching the unit drivers 12x to 12z to one another to be operated, it becomes possible to switch the electric current capability (and the slew rate of the output transistor 11) of the driver 12 in three ways (×1, ×2, and ×3) (see FIG. 14).

The control portion 13 generates the on/off control signal S for the output transistor 11 at a predetermined frequency such that the desired output voltage Vout is generated from the input voltage Vin and is supplied to the load Z.

The enable logic portion 14 generates the enable signals ENx to ENz for the respective unit drivers 12x to 12z in accordance with a slew rate adjustment signal ADJ input from outside of the semiconductor integrated circuit device 110. The enable signals ENx to ENz are each brought to the high level when the operations of the drivers 12x to 12z are permitted, and brought to the low level when the operations of the drivers 12x to 12z are prohibited.

The switching power supply device 101 according to the third embodiment is able to perform variable control of the electric current capability (drive capability) of the driver 12 in accordance with the slew rate adjustment signal ADJ, accordingly, it becomes possible to adjust the slew rate of the output transistor 11 to the optimum value considering the tradeoff between the efficiency of the switching power supply device 101 and the occurrence amount of electromagnetic noise.

Figure 15:
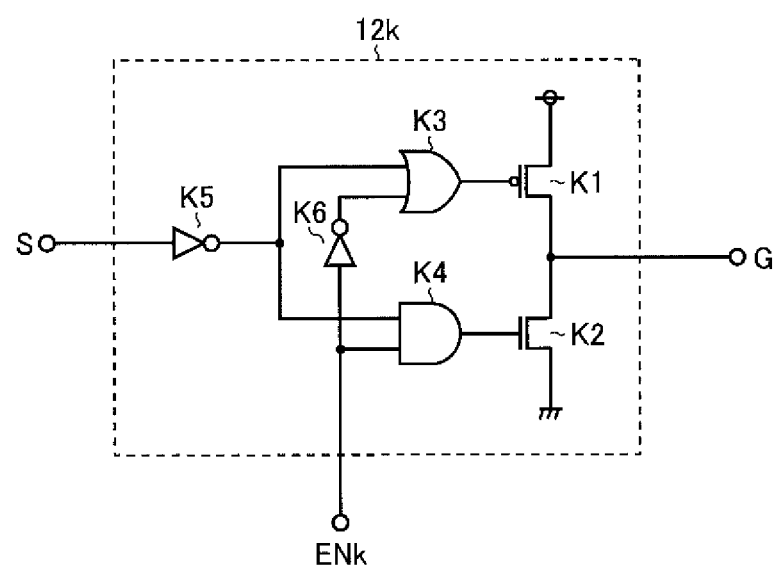
FIG. 15 is a diagram showing a structural example of a driver 12k (where k=x, y, z).

FIG. 15 is a diagram showing a structural example of a driver 12k (where k=x, y, z). The driver 12k in the present structural example includes: a MOS field effect transistor K1 of P channel type; a MOS field effect transistor K2 of N channel type; an OR gate K3; an AND gate K4; NOT gates K5 and K6.

A source of the transistor K1 is connected to the application terminal of the power supply voltage. Both of drains of the transistors K1 and K2 are connected to an application terminal of the gate signal G. A source of the transistor K2 is connected to the ground terminal. A gate of the transistor K1 is connected to an output terminal of the OR gate K3. A gate of the transistor K2 is connected to an output terminal of the AND gate K4. Both of a first input terminal of the OR gate K and a first input terminal of the AND gate K are connected to an output terminal of the NOT gate K5. An input terminal of the NOT gate K5 is connected to an application terminal of the on/off control signal S. A second input terminal of the OR gate is connected to an output terminal of the NOT gate K6. Both of a second input terminal of the AND gate K4 and an input terminal of the NOT gate K6 are connected to an application terminal of the enable signal ENk.

In a case where the enable signal ENk input to the driver 12k is at the high level (logic level during a time of operation permitted), both of the OR gate K3 and the AND gate K go into a state to through-output the on/off control signal S which is inverted in logic by the NOT gate K5. Accordingly, if the on/off control signal S is at the high level, the transistor K1 is turned on and the transistor K2 is turned off, accordingly, the gate signal G goes to the high level. On the other hand, if the on/off control signal S is at the low level, the transistor K1 is turned off and the transistor K2 is turned on, accordingly, the gate signal G goes to the low level.

In contrast, In a case where the enable signal ENk input to the driver 12k is at the low level (logic level during a time of operation prohibited), irrespective of the on/off control signal S, the OR gate K3 outputs the high level, and the AND gate K4 outputs the low level. Accordingly, both of the transistors K1 and K2 are turned off, accordingly, the gate signal G goes into a high impedance state.

As described above, according to the driver 12k in the present structural example, it becomes possible to achieve the enable control by means of the simple circuit structure.

Figure 16:
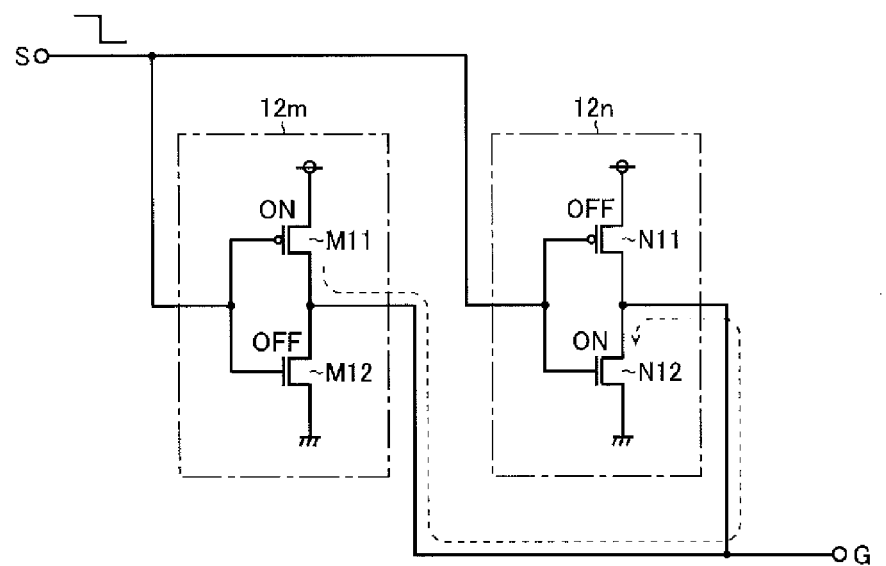
FIG. 16 is a diagram showing a way a through-current occurs between drivers whose sizes are different from each other.

Next, a reason for that the sizes of the transistors which form the respective unit drivers 12x to 12z are made identical to one another is described. FIG. 16 is a diagram showing a way a through-current occurs between the drivers whose sizes are different from each other. Here, transistors M11 and M12 forming a unit driver 12m are smaller in size than transistors N11 and N12 forming a unit driver 12n, and switched in on/off state more quickly. Besides, both of the unit transistors 12m and 12n are in an operation permitted state.

For example, in a case where the on/off control signal S is switched from the high level to the low level, the transistors M11 and M12 forming the unit driver 12m are each switched from an off state to an on state and from the on state to the off state with no delay. On the other hand, the transistors N11 and N12 forming the unit driver 12n are each switched from an off state to an on state and from the on state to the off state later than the transistors M11 and M12. If a concurrent on time span occurs between the transistor M11 and the transistor N12 thanks to such a deviation in on/off switch timing, an extremely large through-current flows through a route that extends from the application terminal of the power supply voltage to the ground terminal via the transistors M11 and N12, which can cause rupture, smoke, fire and the like of the devices.

In contrast to this, in the switching power supply device according to the third embodiment, the sizes of the transistors forming the respective unit drivers 12x to 12z are made identical to one another, accordingly, the above deviation in on/off switch timing does not occur, and it is possible avoid the occurrence of the through-current.

Here, in the third embodiment, the structure is described as an example, in which the output transistor and the driver are each disposed by one; however, in a case where a combination of the above first embodiment (or second embodiment) and third embodiment is used, a structure may be employed, in which a plurality of pairs of the output transistor and the driver are disposed in parallel with one another like in FIG. 5, the plurality of drivers each include a plurality of unit drivers that are each connected in parallel with the control terminal of the corresponding output transistor and independently controlled to or not to operate (i.e., a structure in which the third embodiment is applied to each of the plurality of drivers).

Fourth Embodiment

Figure 17:
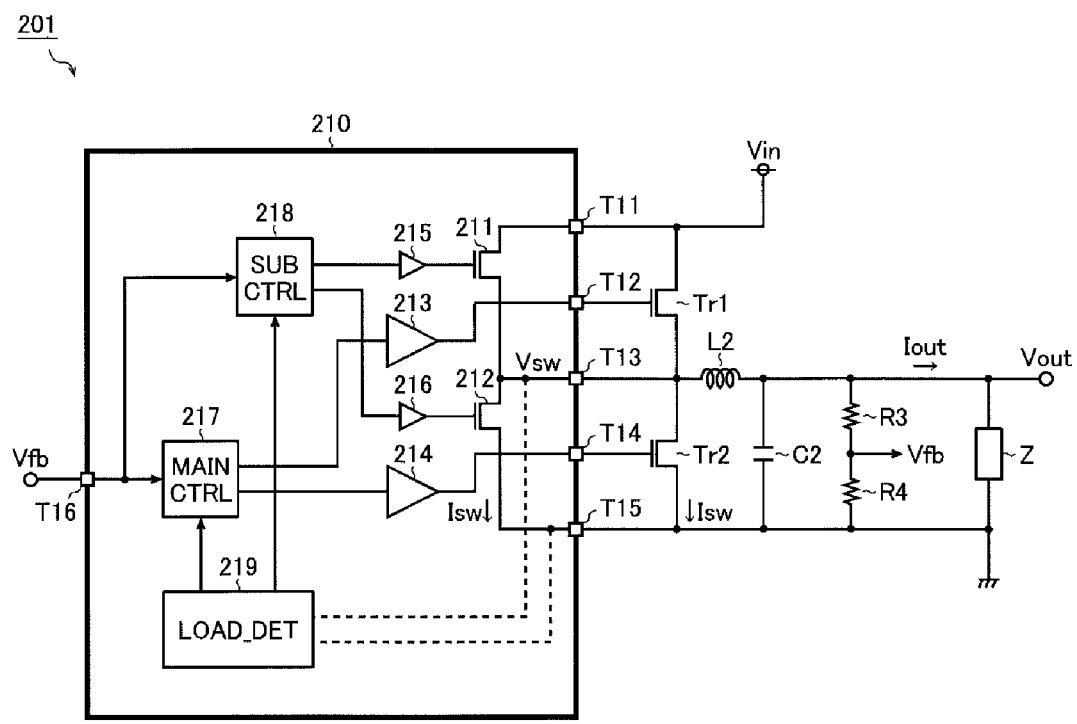
FIG. 17 is a diagram showing a fourth embodiment of a switching power supply device.

FIG. 17 is a diagram showing a fourth embodiment of the switching power supply device. The switching power supply device 201 according to the fourth embodiment is a switching regulator of voltage step-down type that besides a semiconductor integrated circuit device 210, includes, as discrete devices connected to the semiconductor integrated circuit device, MOS field effect transistors Tr1 and Tr2 of N channel type (hereinafter, called main transistors Tr1 and Tr2); a coil L2; a capacitor C1; resistors R3 and R4.

The semiconductor integrated circuit device 210 is provided with external terminals T11 to T16 to secure an electric connection with outside. In outside of the semiconductor integrated circuit device 210, the external terminal T11 is connected to the application terminal of the input voltage Vin and a drain of the main transistor Tr1. The external terminal T12 is connected to a gate of the main transistor Tr1. The external terminal T13 (the application terminal of the switch voltage $V_{SW}$) is connected to a source of the main transistor Tr1, a drain of the main transistor Tr2, and a first terminal of the coil L2. The external terminal T14 is connected to a gate of the main transistor Tr2. The external terminal T15 is connected to a source of the main transistor Tr2 and the ground terminal. A second terminal of the coil L2 is connected to the application terminal of the output voltage Vout. The capacitor C2 is connected between the application terminal of the output voltage Vout and the ground terminal. The resistors R3 and R4 are connected in series with each other between the application terminal of the output voltage Vout and the ground terminal. A connection node between the resistor R3 and the resistor R4 is connected to the external terminal T16 (application terminal of the feedback voltage Vfb) of the semiconductor integrated circuit device 210. The load Z is connected between the application terminal of the output voltage Vout and the ground terminal.

The semiconductor integrated circuit device 210 is a so-called switching power supply IC, and includes: MOS field effect transistors 211 and 212 of N channel type (hereinafter, called sub-transistors 211 and 212); main drivers 213 and 214; sub-drivers 215 and 216; a main controller 217; a sub-controller 218; and a load detection portion 219. Here, in the semiconductor integrated circuit device 210, besides the above circuit blocks, a protection circuit block and the like may be built in when necessary.

A drain of the sub-transistor 211 is connected to the external terminal T11. A source of the sub-transistor 211 is connected to the external terminal T13. In other words, the main transistor Tr1 and the sub-transistor 211 are connected in parallel with each other.

A drain of the sub-transistor 212 is connected to the external terminal T13. A source of the sub-transistor 212 is connected to the external terminal T15. In other words, the main transistor Tr2 and the sub-transistor 212 are connected in parallel with each other.

Here, the main transistors Tr1 and Tr2 are smaller than the sub-transistors 211 and 212 in on resistance value, while the sub-transistors 211 and 212 are smaller than the main transistors Tr1 and Tr2 in gate capacitance value.

The main drivers 213 and 214 each generate a main gate signal in accordance with a main control signal input from the main controller 217 and supply the main gate signal to the main transistors Tr1 and Tr2.

The sub-drivers 215 and 216 each generate a sub-gate signal in accordance with a sub-control signal input from the sub-controller 218 and supply the sub-gate signal to the sub-transistors 211 and 212. Here, the sub-drivers 215 and 216 are formed to be a small size that has a small drive capability compared with the main drivers 213 and 214.

The main controller 217 generates the main control signal at a predetermined frequency to drive the main transistors Tr1 and Tr2 during a time of heavy load mode.

The sub-controller 218 generates the sub-control signal at a predetermined frequency to drive the sub-transistors 211 and 212 during a time of a light load mode.

The load detection portion 219 controls the main controller 217 and the sub-controller 218 to detect the weight of the load Z and to switch the heavy load mode and the light load mode. Here, to detect the weight of the load Z, the load detection portion 219 may be structured to monitor the output current Iout flowing in the load Z or a current or a voltage (the switch current $I_{SW}$ and the switch voltage $V_{SW}$ appearing at the switch terminal T1) equivalent to the output current Iout. Or, to detect the weight of the load Z, the load detection portion 219 may also be structured to receive an information signal about the weight of the load Z from a main controller (not shown) of an application that incorporates the switching power supply device 201.

Figure 13:
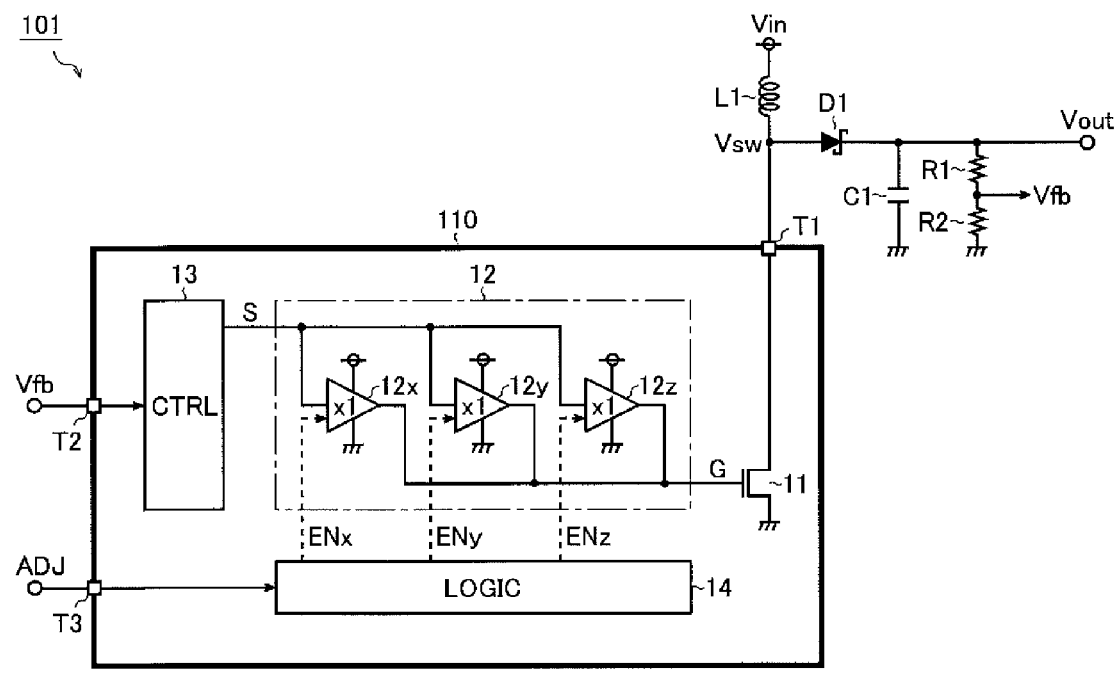
FIG. 13 is a diagram showing a third embodiment of a switching power supply device.

Here, the above main controller 217, sub-controller 218, and load detection portion 219 may be formed a single control portion as shown in the above FIG. 5 and FIG. 13.

In the switching power supply device 201 having the above structure, if the main transistors Tr1 and Tr2, or the sub-transistors 211 and 212 are turned on/off in a complementary manner (exclusively), the pulse voltage $V_{SW}$ having a rectangular wave shape is generated at the external terminal T13. By smoothing this pulse voltage $V_{SW}$, the output voltage Vout obtained by stepping down the input voltage Yin is supplied to the load Z. Here, the word "complementary (exclusive)" covers a case where the on/off states of the main transistors Tr1 and Tr2, or the on/off states of the sub-transistors 211 and 212 are in a completely reverse state, and also a case (case where a concurrent turning-on prevention time span between both the transistors is disposed) where a predetermined delay is given between on/off transition timings of both the transistors from the viewpoint of preventing a through-current.

As described above, the semiconductor integrated circuit device 210 drives the coil L2, an energy storage device, by means of the on/off control of the main transistors T1 and Tr2, or the sub-transistors 211 and 212, thereby functioning as a constituent element of the switching regulator of voltage step-down type that steps down the input voltage Vin to generate the output voltage Vout.

Next, operation mode switch control (main/sub switch control) by the load detection portion 219 is described. As described above, in a light load region, it is desirable to use a small-sized output transistor whose gate capacity is small, in contrast, in a heavy load region, it is desirable to use a large-sized output transistor whose on-resistance is small.

In light of the above knowledge, the load detection portion 219 targets the main transistors Tr1 and Tr2 for driving in the heavy load region, and targets the sub-transistors 211 and 212 for driving in the light load region.

Figure 18:
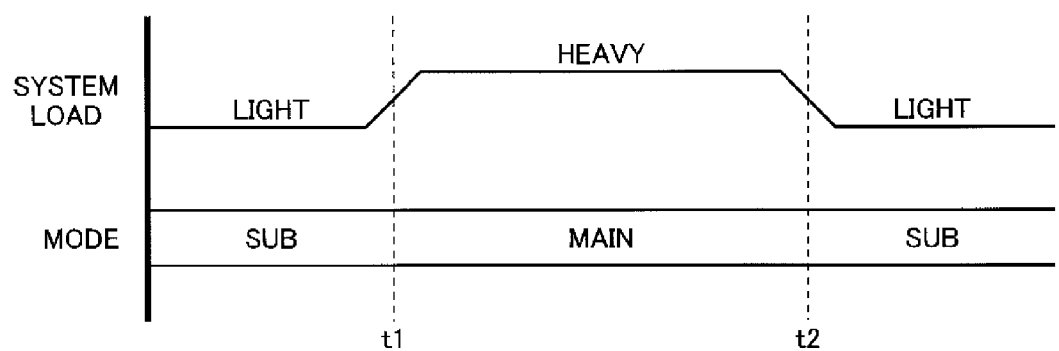
FIG. 18 is a diagram showing an example of main/sub switching control.

FIG. 18 is a diagram showing an example of the main/sub switching control, and in order from op, represents a system load state and an operation mode (main/sub).

As shown in FIG. 18, in the heavy load region (times t1 to t2), the main transistors Tr1 and Tr2, which are smaller than the sub-transistors 211 and 212 in on resistance value, are targeted for driving, while in the light load region (before the time t1, and after the time t2), the sub-transistors 211 and 212, which are smaller than the main transistors Tr1 and Tr2 in gate capacity, are targeted for driving.

As described above, according to the structure in which the output transistor is switched in accordance with the weight of the load Z, like in the above first embodiment (FIG. 5), it becomes possible to achieve high efficiency in a wide load region which ranges from the heavy load region to the light load region without causing a change in the switching frequency.

<Application to Television>

Figure 19:
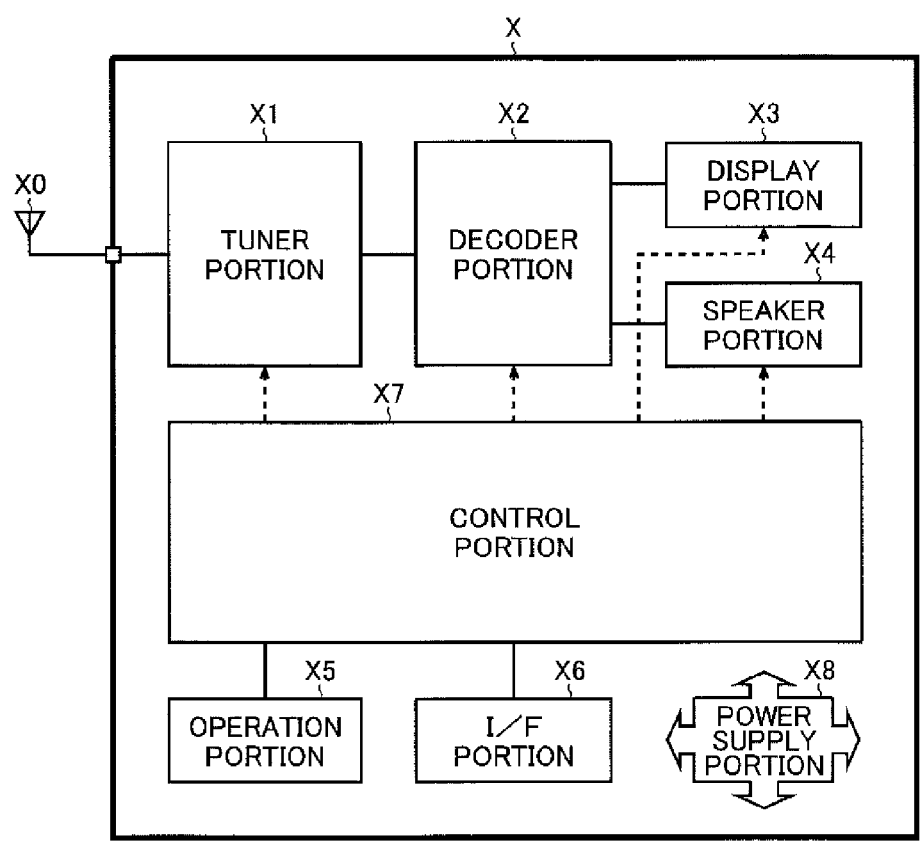
FIG. 19 is a block diagram showing a structural example of a television that incorporates a switching regulator.
Figure 20A:
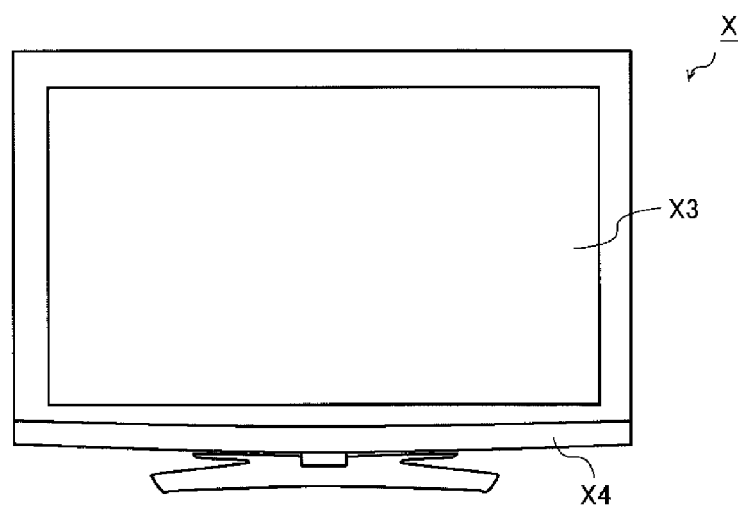
FIG. 20A is a front view of a television that incorporates a switching regulator.
Figure 20B:
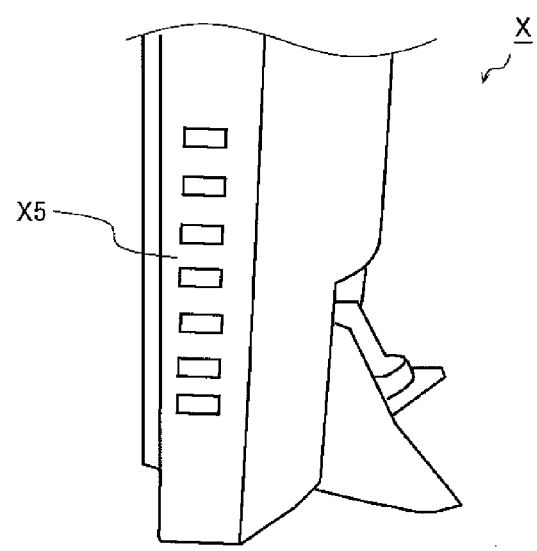
FIG. 20B is a side view of a television that incorporates a switching regulator.
Figure 20C:
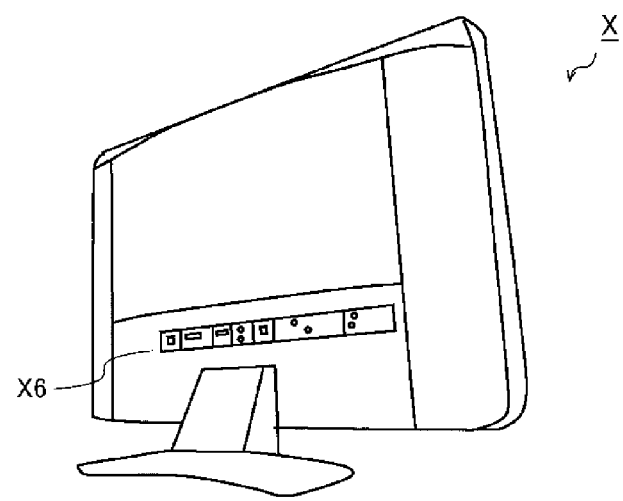
FIG. 20C is a rear view of a television that incorporates a switching regulator.

FIG. 19 is a block diagram showing a structural example of a television that incorporates the switching power supply device. Besides, FIG. 20A to FIG. 20C are respectively a front view, a side view and a rear view of the television that incorporates the switching power supply device. The television X in the present structural example has: a tuner portion X1; a decoder portion X2; a display portion X3; a speaker portion X4; an operation portion X5; an interface portion X6; a control portion X7; as a power supply portion X8.

The tuner portion X1 selects a broadcast signal on a desired channel from a signal that is received by an antenna X0 which is externally connected to the television X.

The decoder portion X2 generates an image signal and a voice signal from the broadcast signal selected by the tuner X1. Besides, also the decoder X2 includes a function to generate an image signal and a voice signal from an external input signal from the interface portion X6.

The display portion X3 outputs the image signal generated by the decoder portion X2 as an image.

The speaker portion X4 outputs the voice signal generated by the decoder portion X2 as a voice.

The operation portion X5 is an human interface that receives a use operation. As the operation portion X5, it is possible to use a button, a switch, a remote controller and the like.

The interface portion X6 is a front end that receives an external input signal from an external device (an optical disc player, a hard disc drive and the like).

The control portion X7 comprehensively controls operation of each of the above portions X1 to X6. As the control portion X7, it is possible to use a CPU [central processing unit] and the like.

The power supply portion X8 supplies power to each of the above portions X1 to X7. As the power supply portion X8, it is possible to preferably use the above switching regulator 2, switching power supply devices 101 and 201.

INDUSTRIAL APPLICABILITY

The switching power supply device disclosed in the present specification is applicable as a power supply of various applications such as an LCD-TV, a PDP-TV, a DVD recorder, a BD recorder and the like.

<Other Modifications>

In the above embodiments, the switching power supply devices of voltage step-up type and voltage step-down type are described as examples; however, the application target of the present invention is not limited to these, but widely applicable to a switching power supply device of voltage step-up/down type.

Besides, it is possible to add various modifications to the various technological features disclosed in the present specification in the scope that does not depart the spirit of the technological creation. For example, mutual replacement of the bipolar transistor and the MOS field effect transistor, and logic level inversion of the various signals are arbitrary. In other words, it should be conceived that the above embodiments are examples in all respects and are not limiting, and it should be understood that the technological scope of the present invention is not indicated by the above description of the embodiments but by the claims, and all modifications within the scope of the claims and the meaning equivalent to the claims are covered.

LIST OF REFERENCE NUMERALS

1 . . . electronic appliance, Q1 . . . first bipolar transistor, M1 . . . switching transistor, 2 . . . switching regulator, Q2 . . . second bipolar transistor, M2 . . . high-side transistor, 3 . . . load, M3 . . . low-side transistor, 10 . . . pulse signal generation portion, 20 . . . driver circuit, 22 . . . high-side variable power supply, 24 . . . low-side variable power supply, 30 . . . slew rate control portion, 32 . . . reference current source, 100 . . . control circuit.

101, 201 switching power supply devices
110, 210 semiconductor integrated circuit devices (switching power supply IC)
11, 11a, 11b, 11c output transistors (NMOSFET)
12, 12a, 12b, 12c drivers
12x, 12y, 12z, 12k unit drivers
13 control portion
130 error amplifier
131 oscillator
132 comparator
133 RS flip-flop
134, 135 comparators
136, 137 D flip-flops
138 determination portion
139 signal gate portion
14 enable logic portion
120 charge pump circuit
121, 122 capacitors
123, 124 diodes
211, 212 MOS field effect transistors of N channel type (sub)
213, 214 main drivers (upper side/lower side)
215, 216 sub-drivers (upper side/lower side)
217 main controller
218 sub-controller
219 load detection portion
L1, L2 coils
C1, C2 capacitors
R1, R2, R3, R4 resistors
D1 Schottky barrier diode
Tr1, Tr2 MOS field effect transistors of N channel type (main)
Z load
T1 switch terminal
T2 feedback terminal
T3 slew rate adjustment terminal
T11 to T16 external terminals
K1, M11, N11 MOS field effect transistors of P channel type
K2, M12, N12 MOS field effect transistors of N channel type
K3 OR gate
K4 AND gate
K5, K6 NOT gates
X televisionX0 antenna
X1 tuner portion
X2 decoder portion
X3 display portion
X4 speaker portion
X5 operation portion
X6 interface portion
X7 control portion
X8 power supply portion

What is claimed is:

1. A switching power supply device comprising:
a plurality of first transistors that are connected in parallel with one another;
a plurality of second transistors that are connected in parallel with one another, the plurality of first transistors and the plurality of second transistors being turned on/off in a complementary manner; and
a control portion that generates on/off control signals for the plurality of first transistors and second transistors at a predetermined frequency such that a particular output voltage is generated from an input voltage and supplied to a load,
wherein the control portion decides a drive-target first transistor and a drive-target second transistor based on a weight of the load;
wherein the plurality of first transistors include a first main transistor externally connected to a semiconductor device and a corresponding first sub-transistor incorporated in the semiconductor device, and the plurality of second transistors include a second main transistor externally connected to the semiconductor device and a corresponding second sub-transistor incorporated in the semiconductor device;
wherein the plurality of first transistors have sources thereof connected together and have drains thereof connected together, and the plurality of second transistors have sources thereof connected together and have drains thereof connected together;
wherein each main transistor has an on resistance value smaller than an on resistance value of the corresponding sub-transistor, and each sub-transistor has a gate capacitance value smaller than a gate capacitance value of the corresponding main transistor;

wherein each of the first main transistor, the second main transistor, the first sub-transistor and the second sub-transistor is an N-channel type transistor; and wherein the switching power supply device further comprises a load detection portion incorporated in the semiconductor device and configured to detect the weight of the load by monitoring a voltage between a switching terminal and a ground terminal of the semiconductor device.

2. The switching power supply device according to claim 1, wherein the control portion targets the main transistors for driving in a heavy load region, and targets the sub-transistors for driving in a light load region.

3. A television comprising:
a tuner portion that selects a broadcast signal for a particular channel from a reception signal;
a decoder portion that generates an image signal and a voice signal from the broadcast signal selected by the tuner portion;
a display portion that outputs the image signal as an image;
a speaker portion that outputs the voice signal as a voice;
an operation portion that receives a user operation;
an interface portion that receives an external input signal;
a control portion that controls operations of the above portions; and
a power supply portion that supplies electric power to each of the above portions;
wherein the power supply portion includes the switching power supply device according to claim 1.

4. The switching power supply device according to claim 1 further comprising:
a first main driver that drives the first main transistor;
a first sub-driver that drives the first sub-transistor;
a second main driver that drives the second main transistor; and
a second sub-driver that drives the second sub-transistor.

* * * * *